(12) United States Patent
Kajino et al.

(10) Patent No.: US 10,414,153 B2
(45) Date of Patent: Sep. 17, 2019

(54) TRANSFER APPARATUS AND TRANSFER METHOD

(71) Applicant: SCREEN Holdings Co., Ltd., Kyoto (JP)

(72) Inventors: Itsuki Kajino, Kyoto (JP); Mikio Masuichi, Kyoto (JP); Hiroyuki Ueno, Kyoto (JP); Kazuhiro Shoji, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 113 days.

(21) Appl. No.: 15/655,483

(22) Filed: Jul. 20, 2017

(65) Prior Publication Data
US 2018/0029353 A1 Feb. 1, 2018

(30) Foreign Application Priority Data

Jul. 26, 2016 (JP) ................. 2016-146218

(51) Int. Cl.
| | |
|---|---|
| *B41F 16/00* | (2006.01) |
| *B41M 1/10* | (2006.01) |
| *B44C 1/10* | (2006.01) |
| *H01L 21/67* | (2006.01) |
| *H01L 21/683* | (2006.01) |

(52) U.S. Cl.
CPC ............ *B41F 16/002* (2013.01); *B41F 16/00* (2013.01); *B41F 16/0033* (2013.01); *B41M 1/10* (2013.01); *B44C 1/10* (2013.01); *H01L 21/67092* (2013.01); *H01L 21/67132* (2013.01); *H01L 21/6838* (2013.01)

(58) Field of Classification Search
CPC .. B41F 17/14; B41F 9/00; B41F 16/00; B41F 16/0006; B41F 1/16; B41F 1/06; B41F 1/54; B41M 1/10; B41M 1/34
See application file for complete search history.

(56) References Cited

U.S. PATENT DOCUMENTS

| | | | | |
|---|---|---|---|---|
| 5,217,550 A | * | 6/1993 | Takeuchi | B41M 5/025 156/229 |
| 2008/0227005 A1 | * | 9/2008 | Tashiro | B41M 1/06 430/48 |
| 2014/0020580 A1 | * | 1/2014 | Yamaguchi | B41F 9/00 101/158 |

FOREIGN PATENT DOCUMENTS

JP 2014-184716 A 10/2014

\* cited by examiner

*Primary Examiner* — Leslie J Evanisko
(74) *Attorney, Agent, or Firm* — Ostrolenk Faber LLP

(57) ABSTRACT

Force for biasing a roller member is changed according to the contact state of first and second plate-like bodies during the travel of the roller member. By that, the pressing force per unit area given from the second plate-like body to the first plate-like body during travel is suppressed. An object to be transferred is satisfactorily transferred despite a change in the contact state of the plate-like bodies during the travel of the roller member.

8 Claims, 14 Drawing Sheets

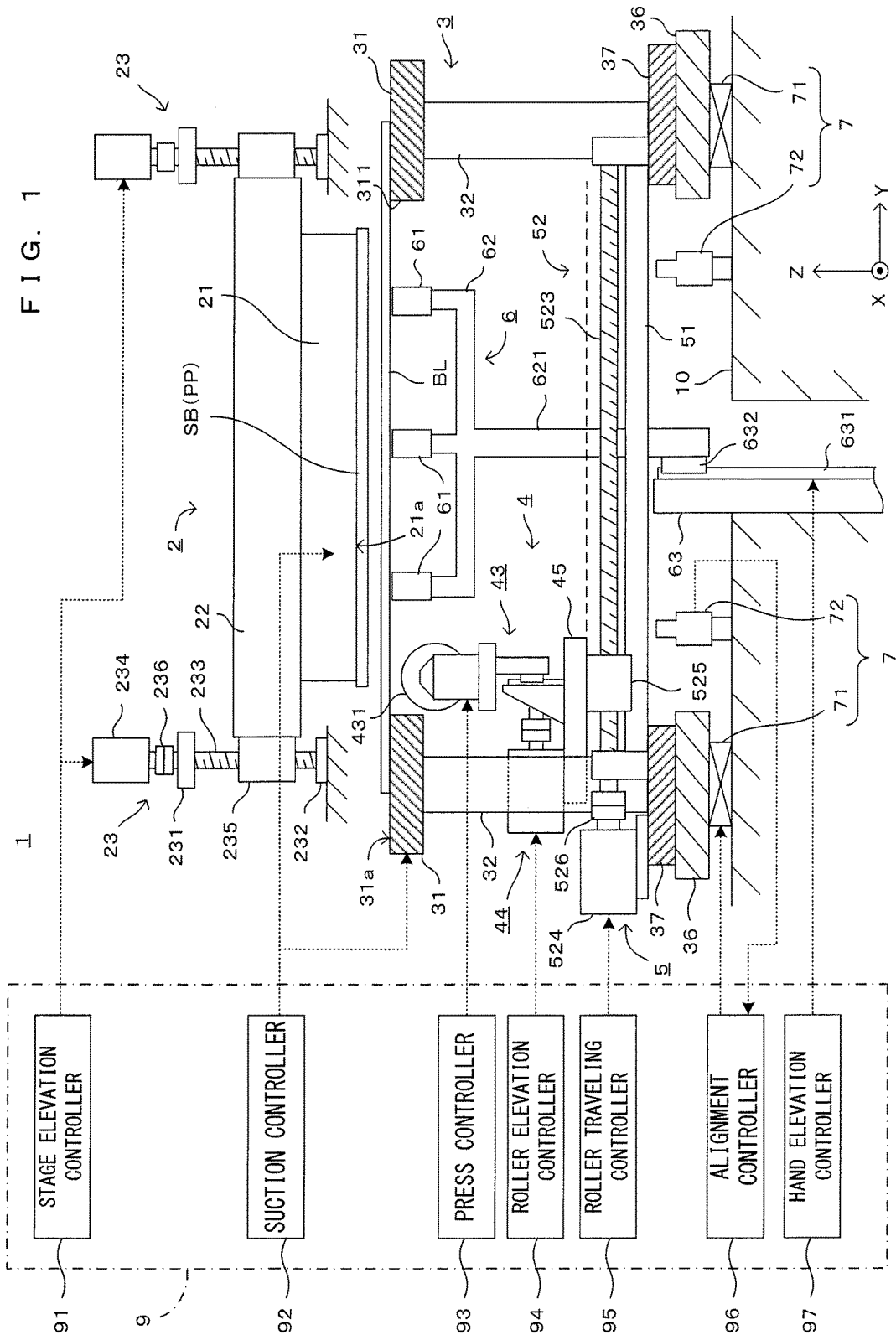
F I G. 1

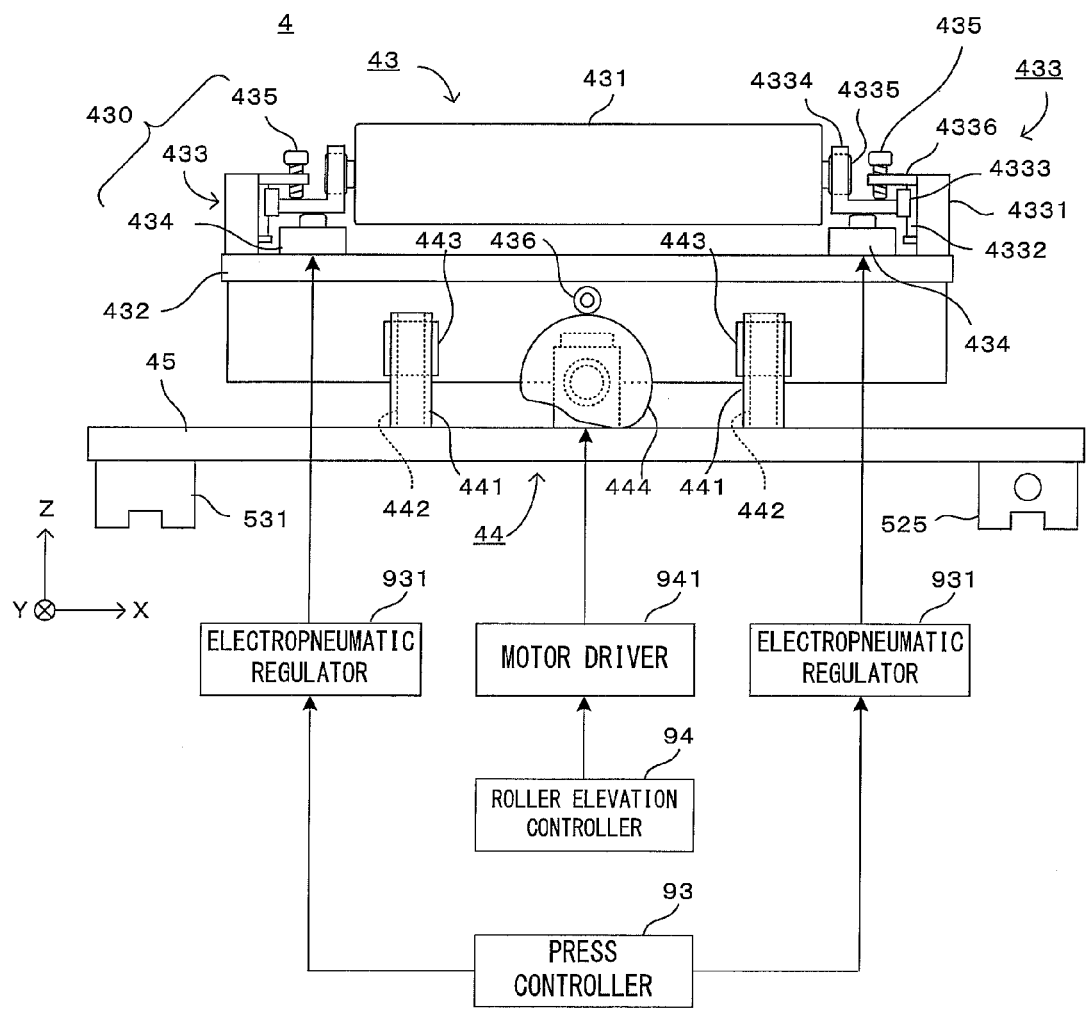
F I G. 4 A

FIG. 6
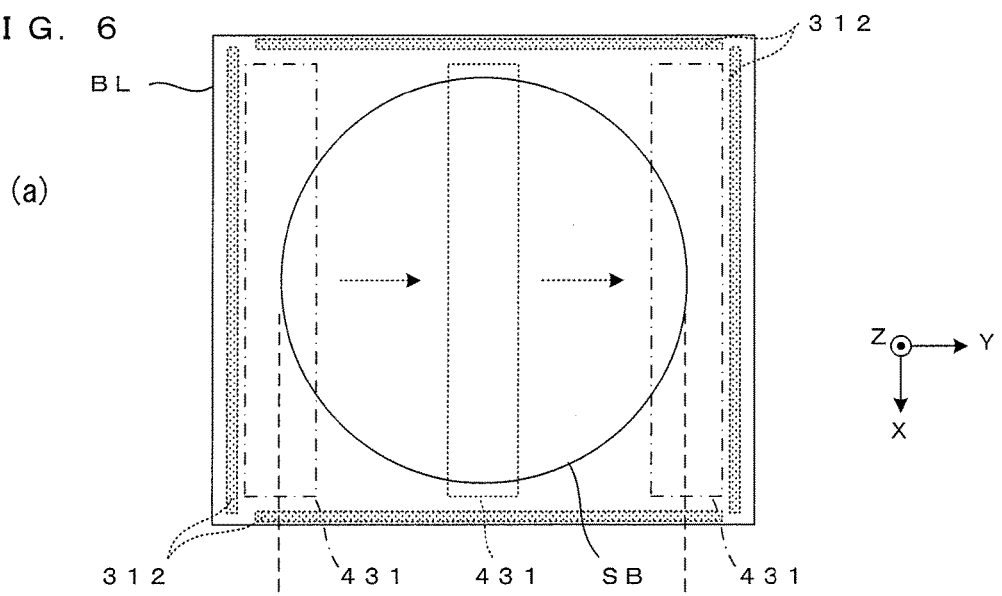
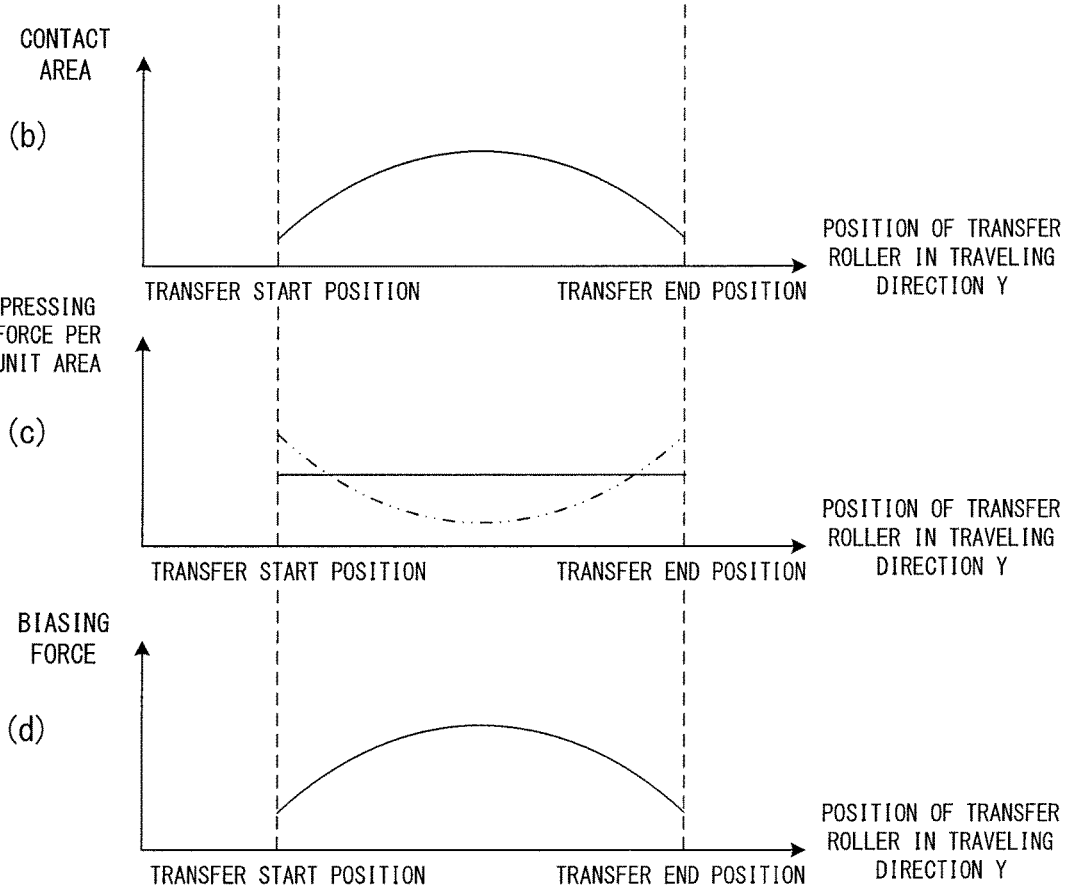

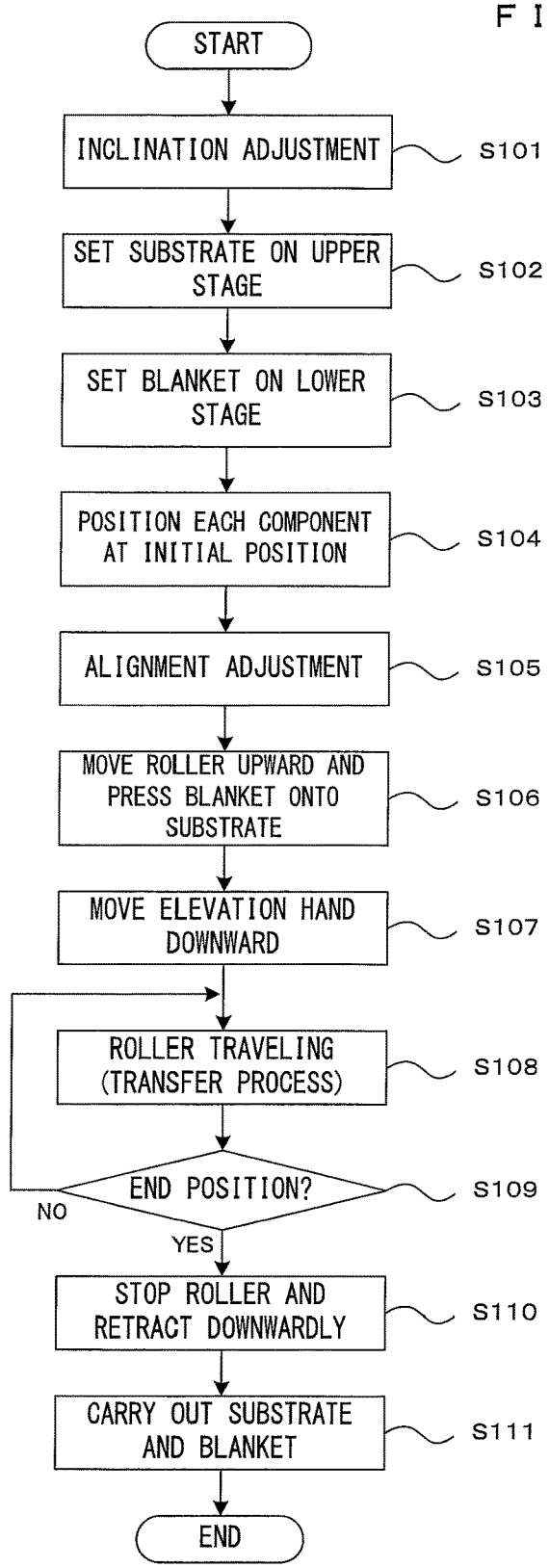

FIG. 12
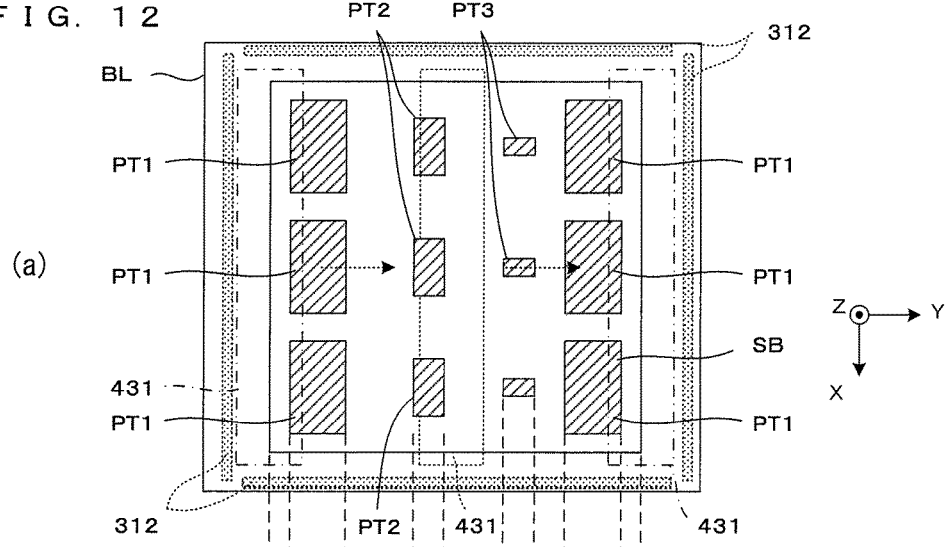
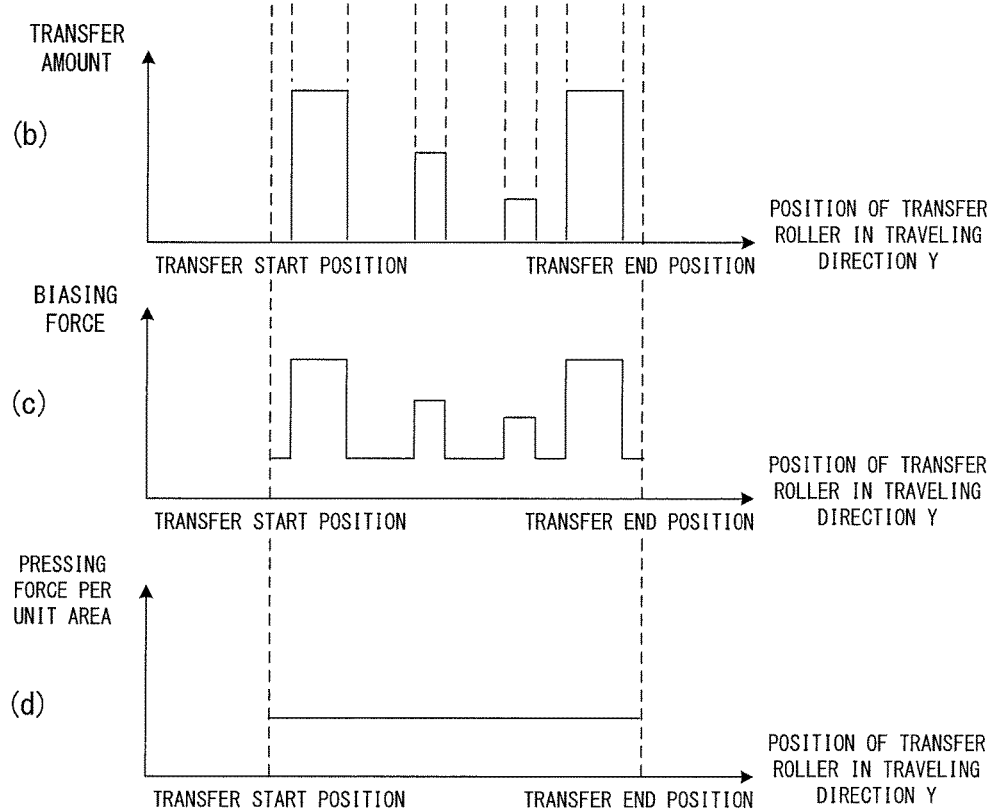

TRANSFER APPARATUS AND TRANSFER METHOD

CROSS REFERENCE TO RELATED APPLICATION

The disclosure of Japanese Patent Application No. 2016-146218 filed on Jul. 26, 2016 including specification, drawings and claims is incorporated herein by reference in its entirety.

BACKGROUND OF THE INVENTION

1. Field of the Invention

This invention relates to a transfer technique for transferring an object to be transferred from one plate body to another plate body by bringing two plate bodies into contact.

2. Description of the Related Art

A technique for transferring an object to be transferred such as a pattern or thin film carried on a principal surface of one plate-like body to another plate-like body by bringing two plate-like bodies into contact with each other is known as a technique for forming a pattern or thin film on a plate-like body such as a glass substrate or semiconductor substrate. One method of this is to bring two plate-like bodies into contact and transfer an object to be transferred by biasing a roller member against one of the two plate-like bodies arranged to proximately face each other across the object to be transferred and, thereby, pressing the one plate-like body against the other plate-like body (see, for example, JP2014-184716A). In this technique, the roller member rotatably supported on both ends is caused to travel along the plate-like body while being pressed against the plate-like body, whereby the plate-like bodies are brought into close contact by a pressing force acting between the plate-like bodies.

SUMMARY OF THE INVENTION

In an apparatus described in JP2014-184716A described above, a central part of the one plate-like body is pressed toward the other plate-like body with a uniform pressing force by causing the roller member to travel while keeping a biasing force against the roller member constant. Thus, if a contact state (e.g. contact area, transfer amount of the object to be transferred or the like) of the two plate-like bodies during the travel of the roller member does not change, the object to be transferred can be satisfactorily transferred from the one plate-like body to the other plate-like body. However, if the above contact state changes, a pressing force per unit area given from the one plate-like body to the other plate-like body during the travel of the roller member may vary. For example, if the other plate-like body is a substantially disc-shaped plate-like body such as a semiconductor wafer, the contact area changes according to the position of the roller member as described in detail later using FIG. 6. Thus, it is difficult to satisfactorily transfer an object to be transferred to a semiconductor wafer by the apparatus described in JP2014-184716A. Such a problem similarly occurs not only when the contact area varies, but also when the contact state varies due to other factors. Note that the "other factors" are also described in detail later.

This invention was developed in view of the above problem and an object thereof is to provide a technique capable of satisfactorily transferring an object to be transferred even if a contact state of two plate-like bodies changes during the travel of a roller member in a transfer apparatus and a transfer method for bringing two plate-like bodies into contact by pressing by the roller member to transfer the object to be transferred.

According to a first aspect of the disclosure, there is provided a transfer apparatus that brings one principal surface of a first plate-like body and one principal surface of a second plate-like body into contact and transfers an object to be transferred carried on one of the first and second plate-like bodies to the other. The apparatus comprises: a first holding mechanism that holds the first plate-like body; a second holding mechanism that proximately holds the second plate-like body while causing the one principal surface of the second plate-like body to face the one principal surface of the first plate-like body held by the first holding mechanism; and a pressing mechanism that presses the second plate-like body against the first plate-like body in a pressing direction from the second plate-like body toward the first plate-like body, wherein: the pressing mechanism includes: a roller member movable in a traveling direction perpendicular to a rotary shaft and parallel to the other principal surface of the second plate-like body while rotating about the rotary shaft parallel to the other principal surface of the second plate-like body with respect to the other principal surface of the second plate-like body; a pressing portion that applies a pressing force from the second plate-like body to the first plate-like body by biasing the roller member against the other principal surface of the second plate-like body in the pressing direction; and a traveling unit that causes the roller member biased by the pressing portion to travel in the traveling direction; and the pressing portion changes a force for biasing the roller member according to a contact state of the first and second plate-like bodies during travel of the roller member to suppress a variation of a pressing force per unit area given from the second plate-like body to the first plate-like body during the travel.

According to a second aspect of the disclosure, there is provided a transfer method that brings one principal surface of a first plate-like body and one principal surface of a second plate-like body into contact and transferring an object to be transferred carried on one of the first and second plate-like bodies to the other. The method comprises: a supporting step of supporting the one principal surface of the first plate-like body and the one principal surface of the second plate-like body proximately facing each other across the object to be transferred; and a transferring step of rolling a roller member including a rotary shaft parallel to the other principal surface of the second plate-like body with respect to the second plate-like body in a traveling direction perpendicular to the rotary shaft and parallel to the other principal surface of the second plate-like body to transfer the object to be transferred while biasing the roller member in a pressing direction from the second plate-like body toward the first plate-like body and pressing the second plate-like body against the first plate-like body; wherein the transferring step includes a step of changing a force for biasing the roller member according to a contact state of the first and second plate-like bodies during travel of the roller member and suppressing a variation of a pressing force per unit area given from the second plate-like body to the first plate-like body during the travel.

In the invention thus configured, the force for biasing the roller member is changed according to the contact state of the first and second plate-like bodies during the travel of the roller member. By that, the pressing force per unit area given from the second plate-like body to the first plate-like body during travel is suppressed. Thus, the object to be transferred is satisfactorily transferred despite a change in the contact state of the plate-like bodies during the travel of the roller member.

As described above, according to the invention, a variation of the pressing force per unit area given to the first plate-like body can be suppressed by controlling the biasing force of the roller member to the second plate-like body during the travel of the roller member, i.e. the object to be transferred can be satisfactorily transferred by stabilizing the above pressing force.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 1 is a drawing which shows a first embodiment of a substrate cleaning apparatus according to the invention.
FIGS. 4A and 4B are front views showing the configuration of the transfer roller block.
FIG. 6 is a drawing which shows operation of a transfer roller block.
FIG. 7 is a flow chart showing the transfer process by this transfer apparatus.
FIG. 12 is a diagram showing the third embodiment of the transfer apparatus according to this invention.

DETAILED DESCRIPTION OF THE PREFERRED EMBODIMENTS

Figure 2:
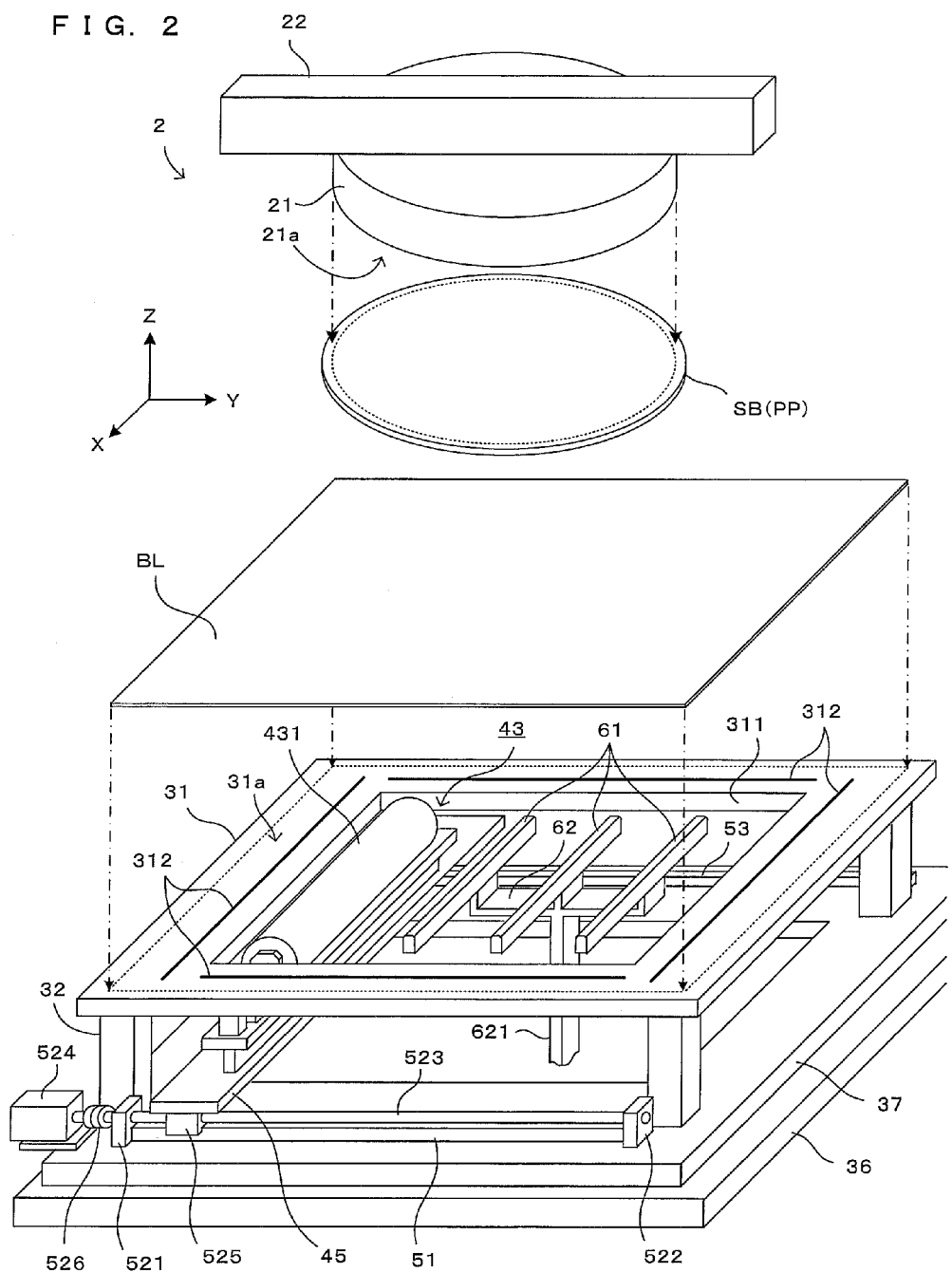
FIG. 2 is a partial plan view of the apparatus shown in FIG. 1.

FIG. 1 is a side view schematically showing a first embodiment of a transfer apparatus according to this invention. Further, FIG. 2 is a diagram showing the configuration of a main part of this transfer apparatus. XYZ orthogonal coordinate axes are set as shown in FIG. 1 to comprehensively show directions in each figure. Here, an XY plane represents a horizontal plane. Further, a Z axis represents a vertical axis, more specifically, a (−Z) direction represents a vertically downward direction.

This transfer apparatus 1 is structured such that an upper stage block 2, a lower stage block 3, a transfer roller block 4, a roller travel driver 5, a supporting hand unit 6 and an alignment unit 7 are arranged on a main frame 10. Further, besides the above, the transfer apparatus 1 includes a control unit 9 for performing a predetermined operation by controlling each component of the apparatus in accordance with a processing program stored in advance.

First, the overall configuration of the transfer apparatus 1 is described. Note that the configurations of the upper stage block 2 and the lower stage block 3 correspond to partial modifications of corresponding configurations described, for example, in the above literature (JP2014-184716A). There are the two principal points in the modifications. First point is of the structure in which the upper stage block 2 is configured that an upper stage 21 holds a disc-shaped plate PP and a substantially disc-shaped plate-like substrate SB such as a semiconductor wafer as shown in FIG. 2. Second point is of the structure in which the lower stage block 3 is configured to change a force for biasing a transfer roller 431 along the vertical direction according to a contact condition between a blanket BL held by the lower stage block 3 and the plate PP or substrate SB held by the upper stage block 2.

The transfer apparatus 1 is a device for forming a pattern by bringing a blanket BL held by the lower stage block 3 and the plate PP or substrate SB held by the upper stage block 2 into contact with each other. A pattern formation process by this apparatus 1 is, more specifically, as follows. First, a coating layer carried on the blanket BL is patterned (patterning process (or referred to as a first transfer process)) by bringing the disc-shaped plate PP prepared to correspond to a pattern to be formed into contact with the blanket BL having a pattern forming material evenly applied thereto. By bringing the thus patterned blanket BL and the substrate SB into contact, the pattern carried on the blanket BL is transferred to the substrate SB (transfer process (or referred to as a second transfer process)). In this way, a desired pattern is formed on the substrate SB.

As just described, this transfer apparatus 1 can be used in both the patterning process and the transfer process in the pattern formation process for forming a predetermined pattern on the substrate SB. Note that this apparatus may be used to be in charge of only one of these processes. Further, this apparatus is usable for the purpose of transferring a thin film carried on the blanket BL to the substrate SB. The configuration and operation of the apparatus are described below, assuming the transfer process of transferring a pattern or thin film formed on a surface of the blanket BL to the substrate SB. However, by replacing the substrate SB by the plate PP, an operation in the patterning process is also described.

The upper stage block 2 includes the upper stage 21 whose flat lower surface serves as a substrate holding surface 21a. The upper stage 21 is attached to a lower part of a beam member 22 extending in a Y direction and held by the beam member 22 such that the substrate holding surface 21a is in a horizontal posture. The beam member 22 is held movably upward and downward along the vertical direction (Z direction) by a pair of stage elevating mechanisms 23, 23 arranged at a distance in the Y direction. In this way, the upper stage 21 is movable in the Z direction.

Although a ball screw mechanism is used as an example of the stage elevating mechanism 23 in this embodiment, there is no limitation to this. The stage elevating mechanism 23 includes a ball screw 233 rotatably supported relative to the main frame 10 by supporting members 231, 232, a motor 234 for rotating the ball screw 233 and a nut portion 235 mounted on the ball screw 233. The ball screw 233 and the motor 234 are coupled via a coupling 236. The motor 234 is connected to a stage elevation controller 91 provided in the control unit 9. The motor 234 rotates in response to a control signal from the stage elevation controller 91, whereby the upper stage 21 is raised and lowered.

Although not shown in figures, the lower surface (substrate holding surface) 21*a* of the upper stage 21 is provided with suction grooves or suction holes. The suction grooves or suction holes are connected to a suction controller 92 provided in the control unit 9. If necessary, a negative pressure is supplied to the suction grooves or suction holes from the suction controller 92. In this way, the upper stage 21 can suck and hold the upper surface of the substrate SB held in contact with the substrate holding surface 21*a*. A planar size of the substrate holding surface 21*a* is slightly smaller than the size of the substrate SB to be held.

The substrate SB is held in a horizontal posture by the upper stage block 2 thus configured. The substrate SB is carried into the apparatus 1 such that a transfer surface, to which a pattern or thin film is to be transferred, is faced down, and sucked and held by the upper stage 21. Further, the stage elevating mechanisms 23 raise or lower the upper stage 21, whereby a gap between the blanket BL held on a lower stage to be described next and the substrate SB is adjusted to a specified value.

The lower stage block 3 includes a lower stage 31 arranged below the upper stage 21. An opening 311 is provided in a central part of the lower stage 31, and the upper surface of the lower stage 31 serves as a flat and horizontal blanket holding surface 31*a*. The lower stage 31 is supported by a plurality of supporting columns 32. A planar size of the lower stage 31 is larger than the size of the blanket BL to be held and an opening size of the opening 311 is larger than a planar size of the substrate SB. The blanket BL is held on the lower stage 31 such that only a peripheral edge part thereof is in contact with the lower stage 31 and the lower surface of a central part excluding the peripheral edge part is open. Suction grooves 312 are provided in an area of the upper surface (blanket holding surface) 31*a* of the lower stage 31 in contact with the blanket BL. The suction grooves 312 are connected to the suction controller 92 of the control unit 9 and a negative pressure is supplied thereto from the suction controller 92 if necessary. In this way, the blanket BL is sucked and held on the lower stage 31. The blanket BL is held in a horizontal posture with a carrying surface carrying the pattern or thin film to be transferred to the substrate SB faced up.

The supporting columns 32 holding the lower stage 31 are fixed to a detachable stage 37 mounted on an alignment stage 36. Each of the alignment stage 36 and the detachable stage 37 is a metal flat plate having an opening in a center, and the detachable stage 37 has an external size slightly smaller than the alignment stage 36. The detachable stage 37 is fixed to the upper surface of the alignment stage 36 by unillustrated fixing member such as screws and integrated with the alignment stage 36. By releasing fixation if necessary, the detachable stage 37 and components mounted thereon can be integrally detached from the alignment stage 36.

The alignment stage 36 is mounted on the main frame 10 via a plurality of alignment mechanisms 71 constituting the alignment unit 7. The alignment mechanisms 71 have, for example, a cross roller bearing mechanism and moves the alignment stage 36 in a horizontal direction (XY direction) and a θ direction about the Z axis in response to a control signal from an alignment controller 96 provided in the control unit 9. When the alignment stage 36 is moved by the alignment mechanisms 71, the detachable stage 37 and the components mounted thereon such as the lower stage 31 also integrally move with the alignment stage 36. In this way, the lower stage 31 moves within a horizontal plane (XY plane) and relative positions of the substrate SB held by the upper stage 21 and the blanket BL held by the lower stage 31 in the horizontal direction are optimized.

The alignment unit 7 includes a plurality of cameras 72. Each camera 72 is attached to the main frame 10 to face the openings of the alignment stage 36 and the detachable stage 37 with an imaging direction aligned with an upward direction. The camera 72 images alignment marks provided on each of the substrate SB and the blanket BL via the blanket BL and generates an image including the both alignment marks. The alignment controller 96 detects the amount of positional deviation between the substrate SB and the blanket BL from the positions of the alignment marks included in the image and operates the alignment mechanisms 71 in accordance with the detected amount of positional deviation, thereby aligning the substrate SB and the blanket BL. By imaging a plurality of alignment marks provided on each of the substrate SB and the blanket BL by the plurality of cameras 72 and performing an alignment, a highly accurate alignment becomes possible.

Further, the supporting hand unit 6 is mounted on the main frame 10. The supporting hand unit 6 includes a plurality of (three in this example) elevation hands 61 successively arranged along the Y direction while facing the opening 311 of the lower stage 31 and a supporting frame 62 integrally supporting these elevation hands. The respective elevation hands 61 are bar-like members extending in the X direction as a longitudinal direction and have the same shape. The upper surfaces of the respective elevation hands 61 are finished into smooth surfaces and the elevation hands 61 are mounted on the supporting frame 62 such that the heights (vertical positions) of the upper surfaces are equal among the plurality of elevation hands 61.

A lower part of the supporting frame 62 serves as a leg part 621 extending downward, and the leg part 621 is supported movably upward and downward by a hand elevation driver 63. In this example, the hand elevation driver 63 is a linear guide. Specifically, the leg part 621 is fixed to a slider 632 attached movably upward and downward to a guide rail 631 fixed to the main frame 10. The slider 632 is controlled to be driven by a hand elevation controller 97 provided in the control unit 9 and moves upward or downward in response to a control signal from the hand elevation controller 97. By doing so, the vertical positions of the respective elevation hands 61 can be collectively changed. Note that various driving mechanisms for realizing a linear movement can be used as the hand elevation driver 63. For example, a ball screw mechanism may be used.

Each elevation hand 61 is positioned at such a position that the upper surface thereof is flush with the substrate holding surface 31*a* of the lower stage 31. The elevation hand 61 auxiliarily supports the lower surface of the central part of the blanket BL held on the lower stage 31 with the lower surface thereof open. In this way, the blanket BL can be horizontally supported to be flat while the deflection thereof is suppressed. Further, by retracting the elevation hands 61 downwardly if necessary, interference with the travel of a transfer roller to be described next is avoided.

The transfer roller block 4 includes a roller unit 43 and a lifter unit 44, and these units 43, 44 are mounted on the upper surface of a plate member 45. The plate member 45 is mounted on the detachable stage 37 via the roller travel driver 5. The roller travel driver 5 includes a guide rail 51 fixed to the detachable stage 37 below a (+X) side end part of the lower stage 31 and extending in the Y direction and a ball screw mechanism 52 provided along the guide rail 51.

A (+X) side end part of the plate member 45 is supported by a nut portion 525 of the ball screw mechanism 52. Further, as shown in FIG. 2, a guide rail 53 is provided on the detachable stage 37 below a (−X) side end part of the lower stage 31. A (−X) side end part of the plate member 45 is supported by a slider 531 (see FIG. 3) mounted on the guide rail 53.

In the roller travel driver 5 for supporting the transfer roller block 4, the ball screw mechanism 52 is provided along the guide rail 51. More specifically, a ball screw 523 is supported by supporting members 521, 522 provided near opposite ends of the guide rail 51 and coupled to a motor 524 via a coupling 526. The nut portion 525 is mounted on the ball screw 523. The motor 524 is connected to a roller traveling controller 95 of the control unit 9. By the rotation of the motor 524, the nut portion 525 horizontally moves in the Y direction along the guide rail 51. Associated with this, the transfer roller block 4 including the plate member 45 supported by the nut portion 525 horizontally moves in the Y direction.

Note that, in FIG. 1, upper end parts of the cameras 72 and the hand elevation driver 63 appear below the guide rail 51 in order to make each component easily visible. However, in the actual apparatus, there is no problem if these positions are located below the lower surface of the plate member 45 shown by a broken line in FIG. 1.

Figure 3:
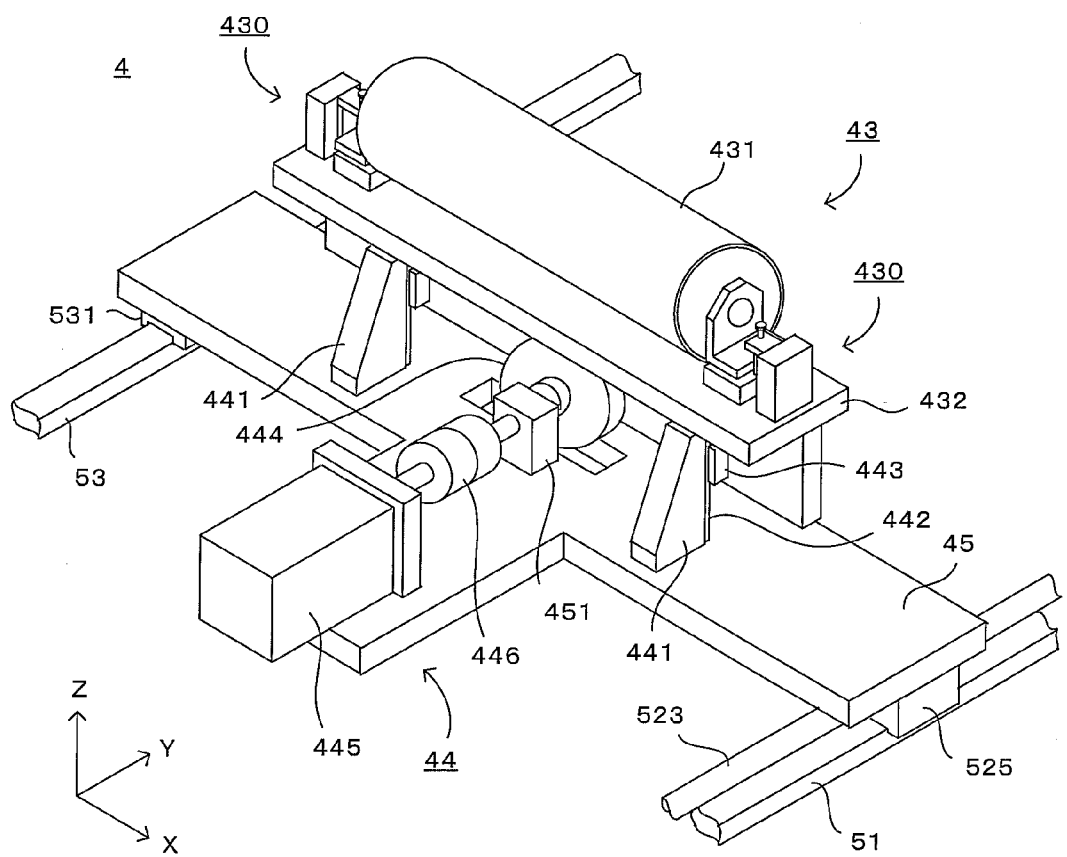
FIG. 3 is a perspective view showing the configuration of the transfer roller block.
Figure 4B:
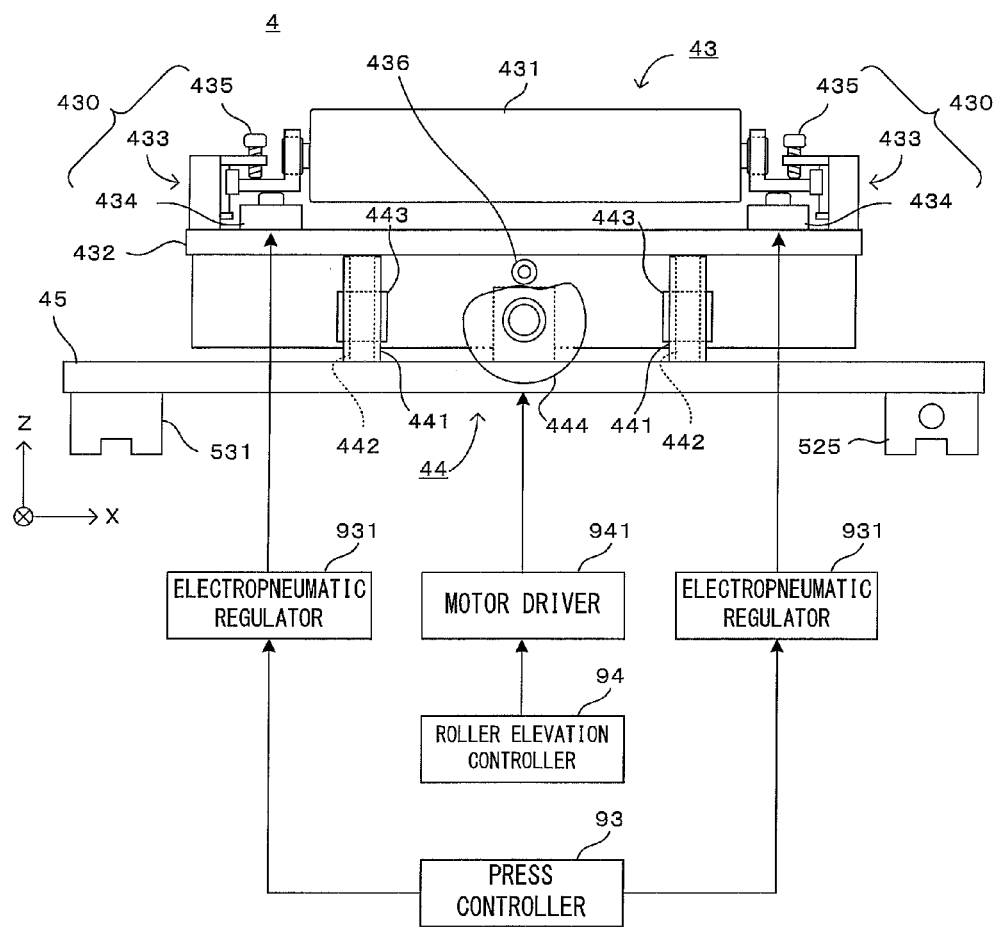
Figure 5A:
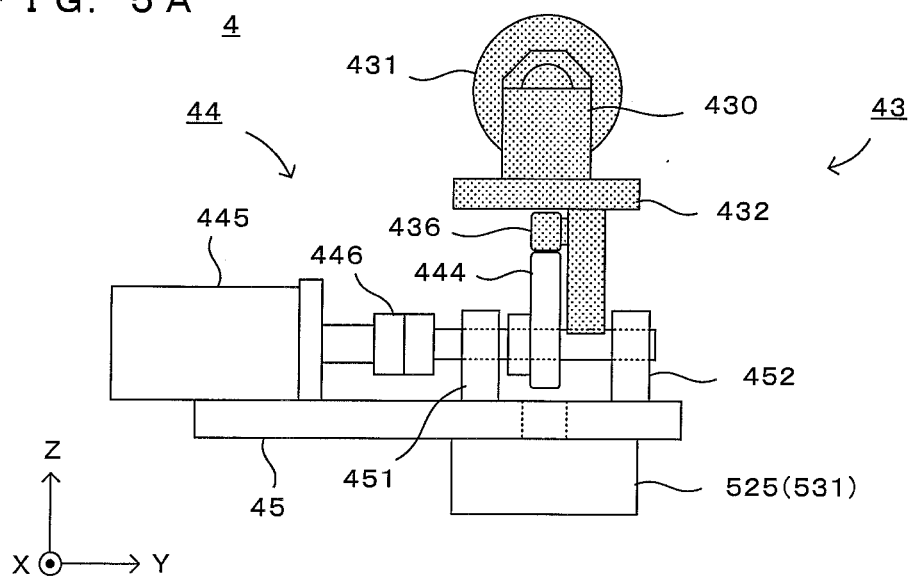
FIGS. 5A and 5B are side views showing the configuration of the transfer roller block.
Figure 5B:
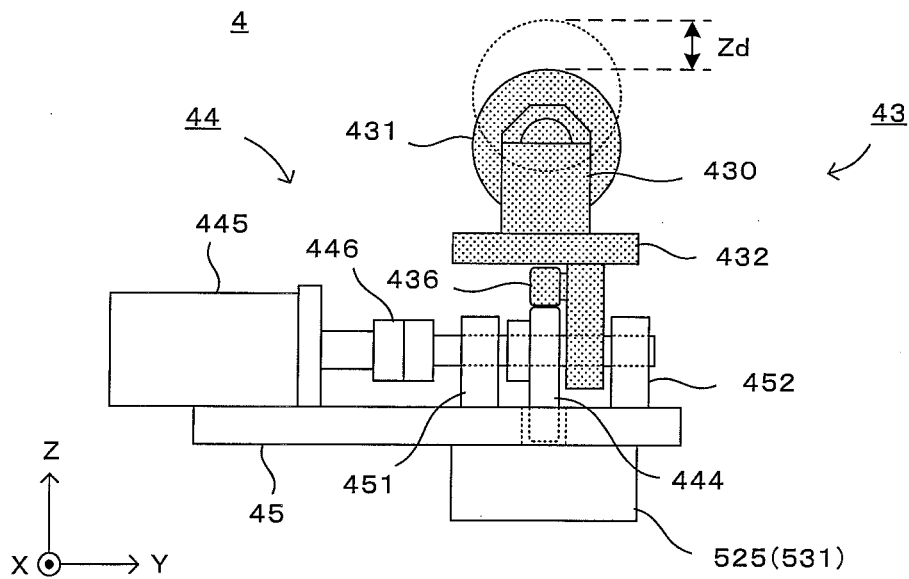

FIG. 3 is a perspective view showing the configuration of the transfer roller block. Further, FIGS. 4A and 4B are front views showing the configuration of the transfer roller block. Further, FIGS. 5A and 5B are side views showing the configuration of the transfer roller block. Note that, in each figure, some members are not shown to make the configuration and operation easily visible. The transfer roller block 4 is structured such that the lifter unit 44 is mounted on the plate member 45 supported in a horizontal posture and movably in the Y direction by the guide rails 51, 53 and the roller unit 43 is supported by the lifter unit 44. The plate member 45 is a substantially T-shaped flat plate member as shown in FIG. 3.

The roller unit 43 provided in the transfer roller block 4 includes a transfer roller 431 formed into a roller shape extending in the X direction as a longitudinal direction. The transfer roller 431 is such that a surface layer of an elastic material, e.g. a rubber material is provided on a surface of a hollow or solid cylindrical core. A length of the transfer roller 431 in the X direction is equal to or longer than that of the substrate SB in the X direction.

The transfer roller 431 is rotatably supported by a pair of supports 430, 430 provided on opposite end parts in the X direction of an elevating member 432 whose upper surface is a horizontal flat surface extending in the X direction as a longitudinal direction. The both supports 430 are symmetrically shaped with respect to a YZ plane and identical in structure. Each of the supports 430 includes a bearing 433, a biasing portion 434 and a stopper 435.

The bearing portion 433 includes a column member 4331 standing on the elevating member 432, a linear guide including a guide rail 4332 provided in the vertical direction on the column member 4331 and a slider 4333 engaged with the guide rail 433, a supporting angle 4334 fixed to the slider 4333 and an auto-centering bearing 4335 mounted on the supporting angle 4334. The auto-centering bearing 4335 rotatably supports a rotary shaft of the transfer roller 431. The supporting angle 4334 is attached to the slider 4333 of the linear guide. Thus, the supporting angle 4334 is vertically movable within a movable range of the linear guide.

The biasing portion 434 for mechanically biasing the supporting angle 4334 upwardly is provided between the supporting angle 4334 and the elevating member 432. For example, an air cylinder can be used as the biasing portion 434. The air cylinder is connected to a press controller 93 provided in the control unit 9 and applies a biasing force set by the press controller 93 to the supporting angle 4334. Upon receiving an upward biasing force, the supporting angle 4334 is displaced upwardly, but that displacement is restricted by the stopper 435.

Specifically, an adjustment screw as the stopper 435 is mounted in a screw hole provided in a plate 4336 attached to an upper part of the column member 4331. By the contact of the lower end of the stopper 435 with the upper surface of the supporting angle 4334, an upward displacement of the supporting angle 4334 is restricted. The stopper 435 restricts a displacement of the supporting angle 4334 against the biasing force from the biasing portion 434 within the movable range of the linear guide and within a range where the supporting angle 4334 is movable upward and downward by the biasing force by the biasing portion 434. Thus, the supporting angle 4334 remains at a fixed position in a state where an upward biasing force from the biasing portion 434 is applied thereto and any further upward displacement thereof is restrained by abutment against the stopper 435. The position (Z-direction position) of the supporting angle 4334 with respect to the elevating member 432 at this time is referred to as a "restrained position" below. The stopper 435 is the adjustment screw and the restrained position can be changed and adjusted by increasing and decreasing a screwed amount of the adjustment screw into the plate 4336. This adjustment can be independently performed between the supports 430, 430 provided on opposite end parts of the transfer roller 431. Note that a certain member may be interposed between the stopper 435 and the supporting angle 4334 instead of such a configuration that the lower end of the adjustment screw as the stopper 435 is directly in contact with the upper surface of the supporting angle 4334.

The supporting angle 4334 positioned at the restrained position at each of the opposite end parts of the elevating member 432 is provided with the auto-centering bearing 4335. The opposite end parts of the transfer roller 431 are rotatably supported by the auto-centering bearings 4335. The restrained positions of the two supporting angles 4334, 4334 are individually adjusted. Thus, not only a direction parallel to the X axis, but also a direction slightly oblique to the X axis in an XZ plane can be set as a direction of the rotary shaft of the transfer roller 431. The supporting angle 4334 is only vertically moved by the liner guide. However, by the auto-centering bearings 4335 supporting the transfer roller 431, the rotation of the transfer roller 431 is prevented from being obstructed even in a state where the rotary shaft is inclined.

The roller unit 43 configured as described above is supported movably upward and downward by the lifter unit 44 provided on the plate member 45. Specifically, the lifter unit 44 includes a pair of column members 441, 441 extending upward from the plate member 45 at positions different in the X direction. A linear guide movable in the vertical direction is attached to each column member 441. More specifically, a guide rail 442 of the linear guide is vertically attached to the column member 441 and a slider 443 engaged movably upward and downward with the guide rail 442 is fixed to the elevating member 432 of the roller unit 43. Thus, the elevating member 432 can move upward and downward in the vertical direction while the upper surface thereof is maintained in a horizontal posture.

Further, the lifter unit 44 includes a cam member 444 arranged between the two column members 441 and a motor 445 for rotating the cam member 444. A rotary shaft of the cam member 444 extends in a horizontal direction parallel to the Y direction and is rotatably supported by bearing members 451, 452 provided on the plate member 45. The rotary shaft of the cam member 444 is connected to the motor 445 via a coupling 446. The motor 445 is fixed to the plate member 45 and connected to a roller elevation controller 94 of the control unit 9 through a motor driver 941.

An upper end part of the cam member 444 is in contact with a cam follower 436 rotatably mounted on the elevating member 432 above the rotary shaft of the cam member 444. Thus, a length from the rotary shaft of the cam member 444 to the upper end part specifies an interval between the elevating member 432 and the plate member 45. The motor 445 rotates the cam member 444, whereby the interval between the elevating member 432 and the plate member 45 changes. Specifically, the cam member 444 has a function of translating a rotational motion of the motor 445 into an upward and downward motion of the elevating member 432.

FIGS. 4A and 5A show a state where a part of the cam member 444 having a relatively large radius is located above by the rotation of the cam member 444 and the length from the rotary shaft to the upper end part is relatively long. At this time, the elevating member 432 is largely lifted up with respect to the plate member 45. On the other hand, FIGS. 4B and 5B show a state where a part of the cam member 444 having a relatively small radius is located above and the length from the rotary shaft to the upper end part is relatively short. At this time, the interval between the plate member 45 and the elevating member 432 becomes smaller. In FIGS. 5A and 5B, the roller unit 43 configured to move upward and downward by the rotation of the cam member 444 is shaded with dots to make the motion easily understandable.

As just described, a height of the elevating member 432 with respect to the plate member 45 changes depending on a rotational angle of the cam member 44, whereby a height of the transfer roller 431 can be changed. By supporting the elevating member 432 by a pair of linear guides (guide rails 442, the sliders 443) provided across the cam member 44, the transfer roller 431 can be parallelly moved in the vertical direction with an angle of the rotary shaft of the transfer roller 431 maintained.

As described later, the upper end of the transfer roller 431 is in contact with the lower surface of the blanket BL held on the lower stage 31, for example, with the transfer roller 431 shown in FIG. 5A lifted upwardly. In this state, the transfer roller 431 is pressed against the lower surface of the blanket BL by the biasing forces given from the pressing portions 434 to the supporting angles 4334 and the transfer roller 431 pushes the blanket BL upwardly to bring the blanket BL into contact with the substrate SB. Further, as described above, the biasing forces by the pressing portions 434 can be changed with high accuracy and excellent response by controlling signals given to electropneumatic regulators 931. Note that the Z-direction position of the transfer roller 431 at this time is referred to as a "pressing position". Further, in this embodiment, a (+Z) direction corresponds to a "pressing direction" of the invention.

With the transfer roller 431 positioned at the pressing position, the roller travel driver 5 causes the transfer roller block 4 to travel in the Y direction. By doing so, the transfer roller 431 moves while pressing the blanket BL against the substrate SB. In this way, a close-contact area where the blanket BL and the substrate SB are held in close contact spreads in the Y direction and, finally, the entire substrate SB is held in close contact with the blanket BL. Further, the biasing forces by the pressing portions 434 can be changed and optimized by variably controlling signals given to the electropneumatic regulators 931 during the travel of the transfer roller 431 in this way. For example, in the first embodiment, the blanket BL is pushed upwardly to be pressed against and brought into contact with the disc-shaped substrate SB by the transfer roller 431. Thus, an area of the upper surface of the blanket BL brought into contact with the lower surface of the substrate SB by the push-up of the transfer roller 431 (hereinafter, referred to as a "contact area") continuously changes according to the travel of the transfer roller 431 as shown in FIG. 6. Thus, if the above biasing forces are set at a fixed value, the pressing force per unit area changes in accordance with the position of the transfer roller 431 in the traveling direction Y according to the travel of the transfer roller 431. In contrast, the pressing force per unit area can be maintained substantially constant by changing the biasing forces. Note that, in a plan view (a) of FIG. 6, a sucking and holding position is made easily understandable by dotting parts of the blanket BL sucked and held by the suction grooves 312. This point similarly applies also in FIGS. 11 to 13 to be described later.

On the other hand, the transfer roller 431 is largely separated downwardly from the blanket BL, for example, in a state where the transfer roller 431 is located below as shown in FIG. 5B. Accordingly, the Z-direction position of the transfer roller 431 at this time is referred to as a "separated position". A difference between the pressing position and the separated position, i.e. a height indicated by Zd in FIG. 5B is about several mm through 30 mm This height difference is specified by a radius change amount associated with the rotation of the cam member 444.

As shown in FIGS. 3 and 4A, opposite end parts of the plate member 45 in the X direction extend further outward than the opposite end parts of the transfer roller 431. Further, as shown in FIG. 2, the opposite end parts of the plate member 45 in the X direction extend further outward than opposite end surfaces in the X direction of the opening 311 in the central part of the lower stage 31 and extend up to the vicinities of opposite outer peripheral end parts of the lower stage 31 in the X direction. The opposite end parts of the plate member 45 in the X direction are supported on the guide rails 51, 53 substantially below the opposite outer peripheral end parts of the lower stage 31 in the X direction. In this way, the plate member 45 is supported at opposite end positions widely distant in the X direction. Thus, also when the transfer roller 431 travels in the Y direction while pressing the blanket BL, it is possible to maintain the plate member 45 in a horizontal posture by suppressing the inclination of the plate member 45. In this way, the travel of the roller unit 4 is stabilized.

Next, a transfer process by the transfer apparatus 1 configured as described above is described. Here, a transfer process of transferring a pattern or thin film from the blanket BL to the substrate SB is described. As described above, by replacing the substrate SB by the plate PP, an operation in the patterning process is also described. The transfer process described below is realized by the control unit 9 causing each component of the apparatus to perform a predetermined operation by executing a control program prepared in advance. Further, since the substrate SB is disc-shaped in this embodiment as described above, the contact area continuously changes according to the travel of the transfer roller 431 as shown in FIG. 6. Accordingly, correlation data representing a relationship between the position of the transfer roller 431 in the traveling direction Y and the contact area (graph in (b) of FIG. 6) is stored in a table format as the contact state in this embodiment in a memory (not shown) of the control unit 9. The transfer process is performed using this. Note that a function representing the above relationship may be stored in the memory instead of the correlation data and this function may be used. This point similarly applies also in embodiments to be described later.

FIG. 7 is a flow chart showing the transfer process by this transfer apparatus. Further, FIGS. 8A to 8D are diagrams schematically showing the position of each component in the process of the transfer process. At first, an inclination adjustment process of the transfer roller 431 is performed (Step S101). In this embodiment, the transfer roller 431 separated from the blanket BL is supported by the supporting angles 4334 restrained at the restrained position by the stopper members 435 and the restrained position is adjustable by adjustment screws. If the restrained position is adjusted in advance at both end parts of the transfer roller 431, so that the roller upper end and the lower surface of the blanket BL are parallel to each other, immediately before the transfer roller 431 comes into contact with the blanket BL, the transfer roller 431 can be uniformly and evenly brought into contact with the blanket BL in the X direction. Such an adjustment process is performed beforehand as an "inclination adjustment process" in Step S101 of FIG. 7. In this way, the direction of the rotary shaft of the transfer roller 431 is adjusted in a predetermined angle range within the XZ plane centered on a direction parallel to the X direction.

In the transfer process, a substrate SB to which a pattern or thin film is to be transferred is carried into the apparatus and set on the upper stage 21 (Step S102). The upper stage 21 sucks and holds the substrate SB such that a transfer surface to which the pattern or thin film is to be transferred is faced down. Subsequently, a blanket BL carrying the pattern or thin film to be transferred to the substrate SB is carried into the apparatus and set on the lower stage 31 (Step S103). The lower stage 31 sucks and holds the blanket BL such that a carrying surface carrying the pattern or thin film is faced up.

Figure 8A:
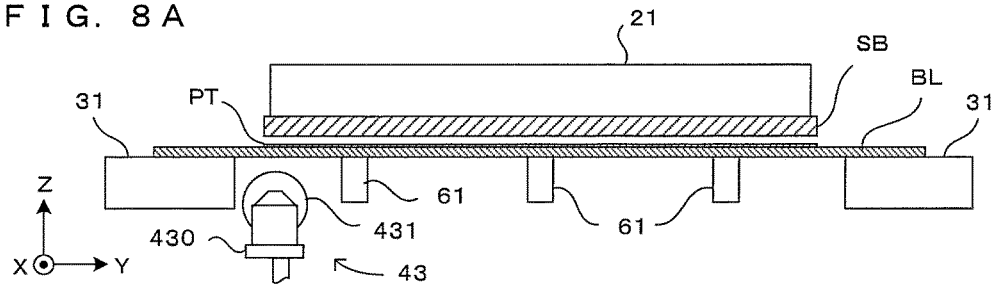
FIGS. 8A to 8D are diagrams schematically showing the position of each component in the process of the transfer process.

Subsequently, each component of the apparatus is positioned at a predetermined initial position (Step S104). FIG. 8A shows the initial position of each component. The upper stage 21 and the lower stage 31 are arranged to proximately face each other such that the substrate SB and the blanket BL face each other in parallel across a predetermined gap. Further, the elevation hands 61 are raised to a position where the upper surfaces thereof are flush with the upper surface of the lower stage 31 and come into contact with the lower surface of the blanket BL to support the blanket BL in a horizontal posture. The transfer roller 431 is positioned at the separated position to be separated downwardly from the lower surface of the blanket BL at a position right below one end part of the substrate SB in the Y direction. In FIG. 8A, PT denotes an object to be transferred (pattern or thin film) from the blanket BL to the substrate SB.

Subsequently, an alignment adjustment process of adjusting the positions of the substrate SB and the blanket BL in the horizontal direction is performed (Step S105). Specifically, based on images imaged by the cameras 72, the alignment mechanism 7 moves the alignment stage 36 in a horizontal plane if necessary such that the pattern or thin film PT carried on the blanket BL and the substrate SB have a positional relationship determined in advance in the horizontal direction.

Figure 8B:
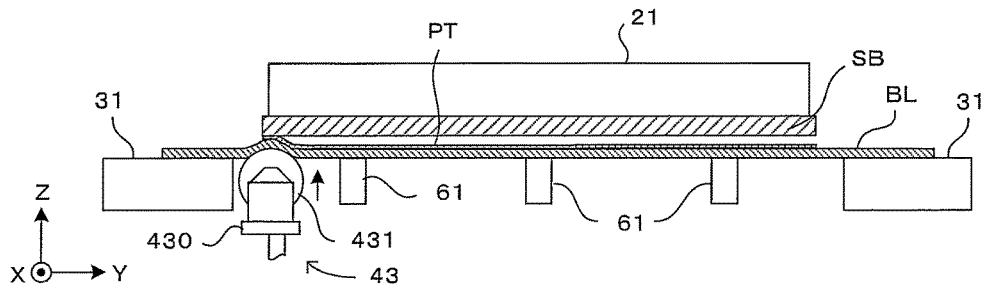

After the alignment adjustment process, the motor 445 rotates the cam member 444, whereby the transfer roller 431 moves upward to come into contact with the lower surface of the blanket BL and press the blanket BL upwardly as shown in FIG. 8B (Step S106). The transfer roller 431 continues to move upward also after coining into contact with the lower surface of the blanket BL, whereby the blanket BL is pushed up by the transfer roller 431 and, finally, the upper surface of the blanket BL comes into contact with the lower surface of the substrate SB. In this way, the pattern or thin film PT carried on the upper surface of the blanket BL is held in close contact with the substrate SB.

Further, the pattern or thin film PT is pressed against the substrate SB by the transfer roller 431 pushing up the blanket BL. In this way, the transfer of the pattern or thin film PT to the substrate SB is started. The position of the transfer roller 431 in the traveling direction Y at this time is referred to as a "transfer start position" in this specification. Note that since the blanket BL is kept in a horizontal posture by being supported by the elevation hands 61 at this point of time, a positional deviation in the horizontal direction when the blanket BL is pushed up is prevented and the pattern or thin film PT is properly transferred to a predetermined position of the substrate SB.

Figure 9:
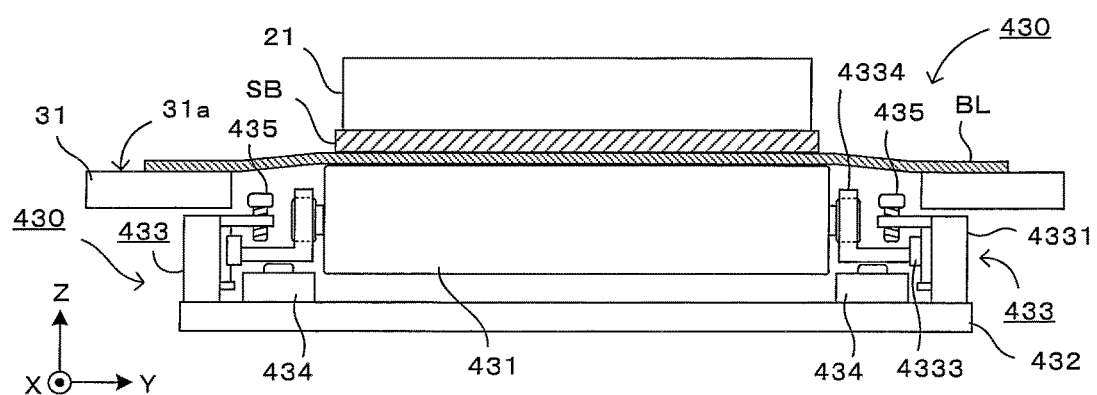
FIG. 9 is a drawing which shows operation of the transfer roller block.

Further, when the transfer is started at the transfer start position, the transfer roller 431 is released from restraint by the stoppers 435, becomes vertically movable and is pressed against the blanket BL by upward biasing forces by the pressing portions 434 as shown in FIG. 9. Accordingly, the magnitude of a pressing force of the transfer roller 431 to the blanket BL is determined by the biasing forces by the pressing portions 434. In this embodiment, the pressing portions 434 are air cylinders and air pressures to be given to these air cylinders can be adjusted by the electropneumatic regulators 931. Thus, the biasing forces can be adjusted with high accuracy and high resolution by controlling the signals given from the press controller 93 to the electropneumatic regulators 931 based on the above correlation data. Particularly, since a contact area is small when the transfer roller 431 is located at the transfer start position as shown in FIG. 6, the biasing force by the pressing portion 434 is set to be relatively small as shown in a graph (d) in FIG. 6.

Figure 8C:
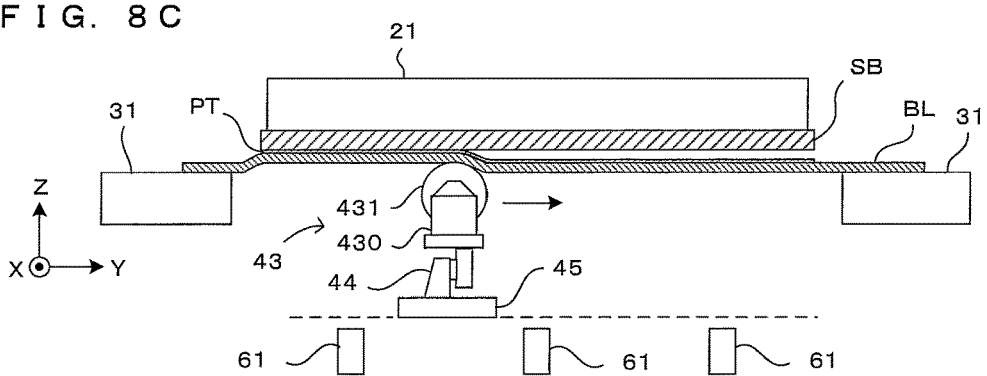

When the substrate SB and the blanket BL come into contact by being pressed by the transfer roller 431, the elevation hands 61 move downward and are separated from the blanket BL (Step S107) as shown in FIG. 8C and the roller unit 43 starts traveling in a (+Y) direction (Step S108). The lowered positions of the elevation hands 61 at this time are such that the upper surfaces thereof are located below the lower surface position of the plate member 45 shown by a broken line in FIG. 8C.

Further, the blanket BL and the substrate SB contact via the pattern or thin film PT and the close contact area spreads in the Y direction as shown in FIG. 8C by the transfer roller 431 traveling in the Y direction while pressing the blanket BL against the substrate SB. In this way, the pattern or thin film PT is successively transferred to the substrate SB (transfer process).

Further, during the travel of the transfer roller 431, the contact area of the blanket BL and the substrate SB increases as the transfer roller 431 is pushed up as shown in FIG. 6 described above, peaks at an intermediate point of time of the transfer process and, thereafter, decreases. Accordingly, in this embodiment, the biasing forces by the pressing portions 434 are increased and decreased according to the position of the transfer roller 431 as shown in the graph (d) of FIG. 6 by controlling the signals given from the press controller 93 to the electropneumatic regulators 931 based on the above correlation data. That is, the biasing forces are increased as the contact area increases and, conversely, the biasing forces are decreased as the contact area decreases, whereby the pressing force per unit area has a substantially constant value regardless of the position of the transfer roller 431 in the traveling direction Y as shown in a graph (c) in FIG. 6. As a result, the transfer can be satisfactorily performed.

Figure 8D:
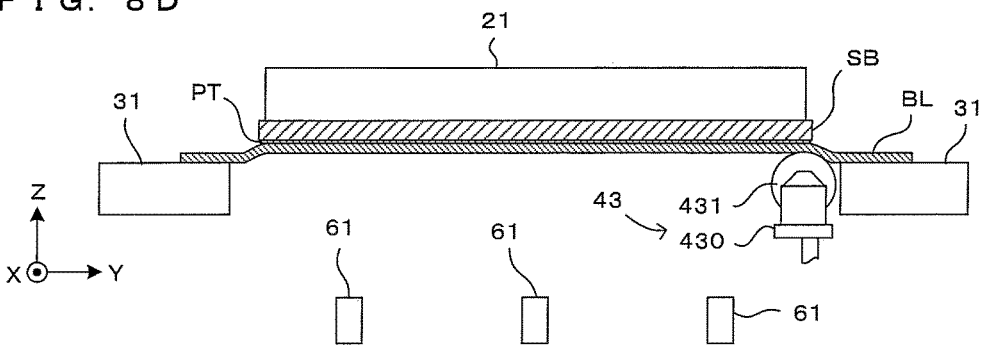

The travel of the roller unit 43 and a variable control of the biasing forces are continued until the transfer roller 431 reaches an end position immediately below the other end part of the substrate SB as shown in FIG. 8D (Step S109). This causes the entire substrate SB to be held in close contact with the blanket BL and the transfer of the pattern or thin film TP to the substrate SB is completed. At this point of time, the movement of the roller unit 43 is stopped and the roller unit 43 is separated from the blanket BL and retracted downwardly (Step S110). The blanket BL and the substrate SB held in close contact in this way are integrally carried out (Step S111) and the transfer process in this transfer apparatus 1 is finished.

As described above, in the case of performing the transfer process by pressing the blanket BL against the disc-shaped substrate SB or plate PP by the transfer roller 431 traveling in the Y direction, the contact area varies according to the position of the transfer roller 431 in the traveling direction Y as shown in FIG. 6. To suppress the influence of this variation of the contact area, the correlation data (see (b) in FIG. 6) indicating the relationship of the above position and the contact area is stored in advance as information indicating the contact state and the biasing forces by the pressing portions 434 are controlled based on the position of the transfer roller 431 in the traveling direction Y (see (d) in FIG. 6) in the first embodiment. That is, by changing the biasing forces in proportion to the contact area, the variation of the pressing force per unit area given from the blanket BL to the substrate SB or plate PP is suppressed and stabilized to be substantially constant (see (c) in FIG. 6). As a result, the object to be transferred can be satisfactorily transferred.

Note that, in the first embodiment, the contact state occurs in which the contact area of the substrate SB or the like and the blanket BL by pressing by the transfer roller 431 changes according to the position of the transfer roller 431 in the traveling direction Y since the substrate SB or plate PP is disc-shaped. In view of this, in the first embodiment, the biasing forces are controlled. Of course, even if the substrate SB or plate PP has a shape other than a disc shape, the above contact state may occur. For example, the above contact state occurs also when the substrate SB or plate PP has a shape other than a rectangular shape or when the substrate SB or plate PP is inclined with respect to the transfer roller 431 (when a width direction of the substrate SB or plate PP is not parallel to the rotary shaft of the transfer roller 431) although having a rectangular shape. Thus, also in these cases, the pattern or thin film PT can be satisfactorily transferred even if the contact state of the blanket BL and the substrate SB or plate PP varies during the travel of the transfer roller 431 by controlling the biasing forces based on the correlation data as in the above first embodiment.

Factors of the contact state include bending rigidity of the blanket BL, an uneven transfer amount, an uneven thickness of the blanket BL and the like besides the above contact area. The invention can be applied also when the contact state changes according to the position of the transfer roller 431 in the traveling direction Y due to such factors.

Figure 10:
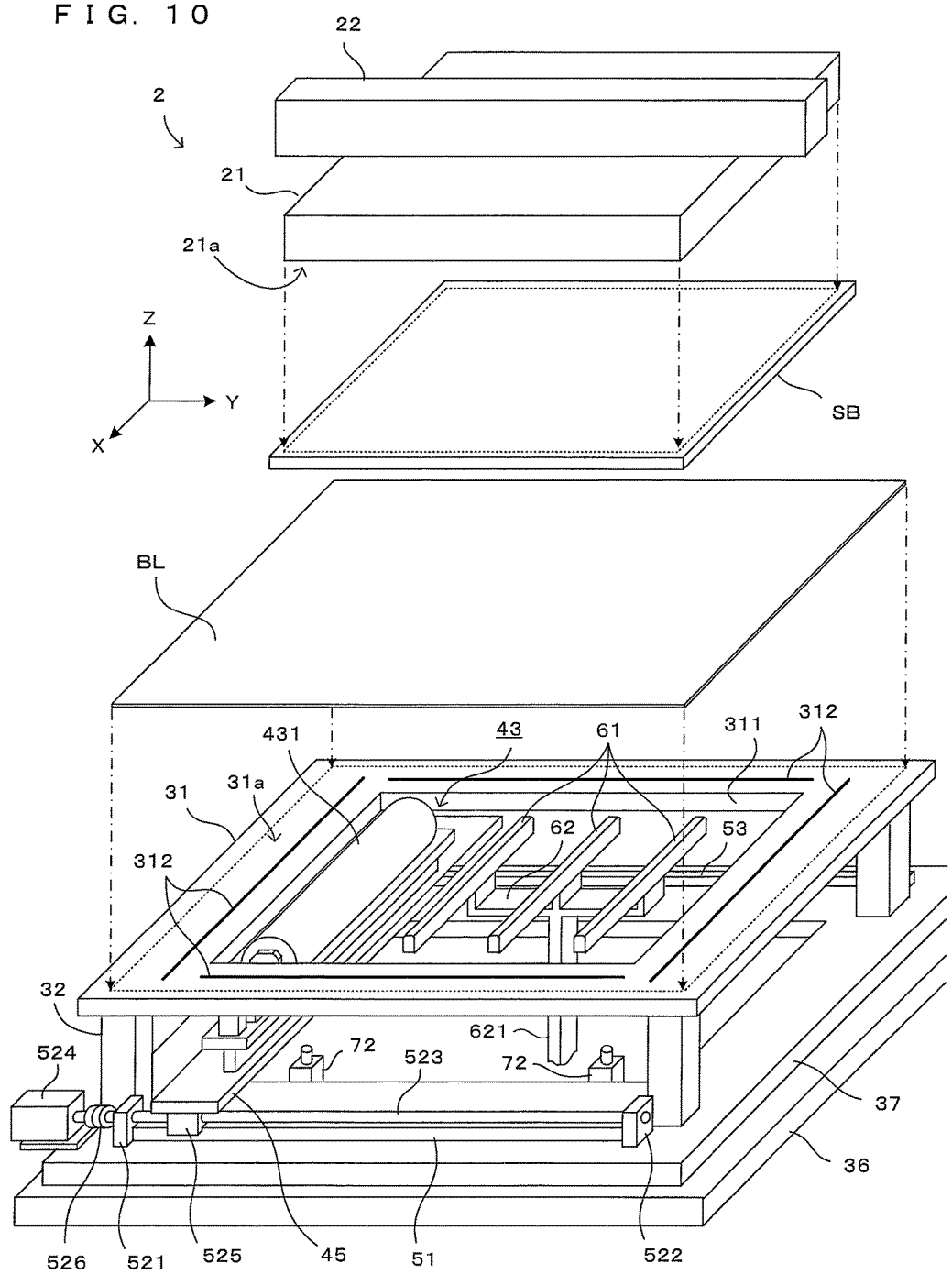
FIG. 10 is a diagram showing a second embodiment of the transfer apparatus according to this invention
Figure 11:
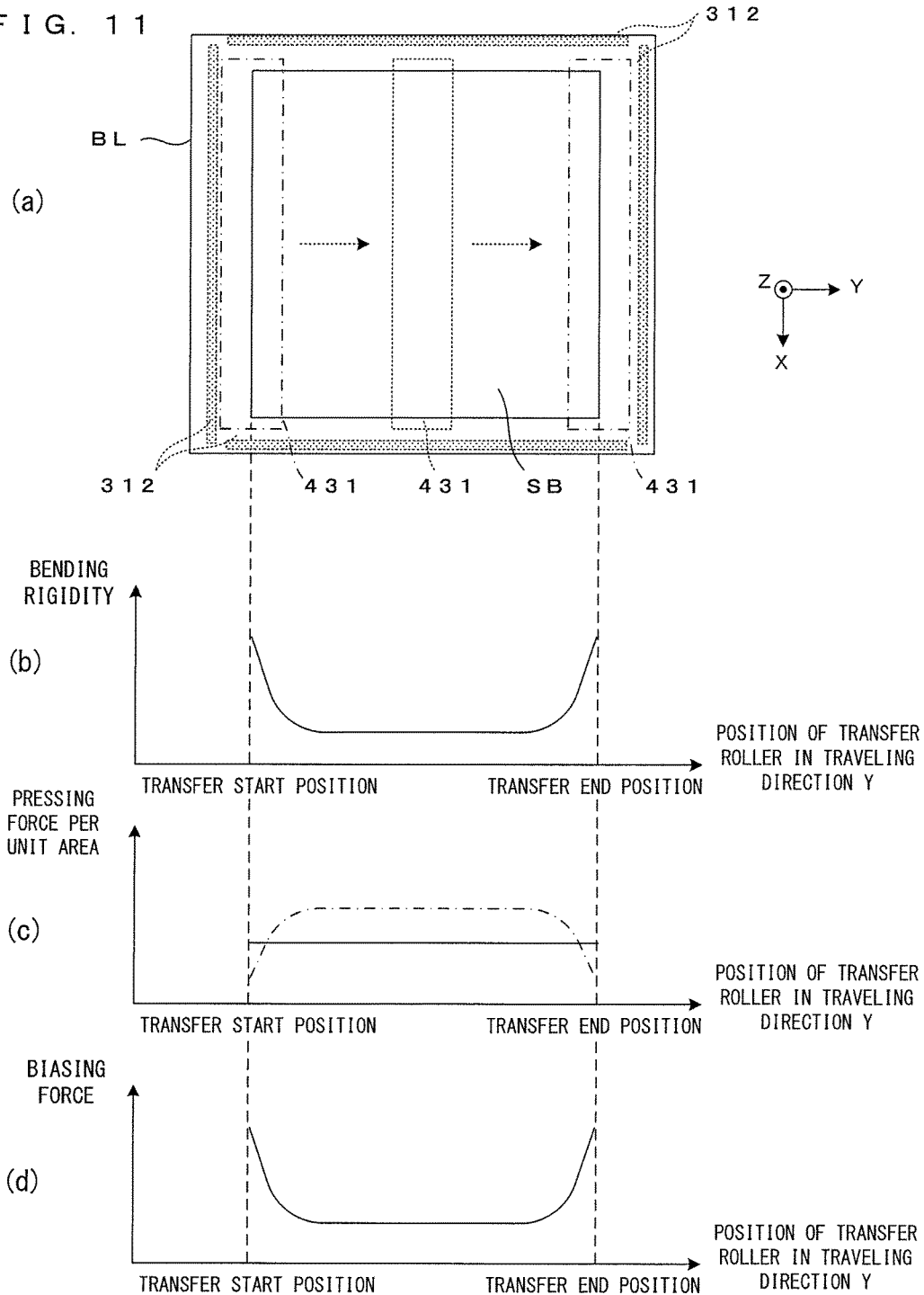
FIG. 11 is a diagram schematically showing the operation of a transfer roller block in the transfer apparatus shown in FIG. 10.

FIG. 10 is a diagram showing a second embodiment of the transfer apparatus according to this invention. Further, FIG. 11 is a diagram schematically showing the operation of a transfer roller block in the transfer apparatus shown in FIG. 10. This second embodiment largely differs from the first embodiment in that a lower surface (substrate holding surface) 21a of an upper stage 21 is finished in a rectangular shape to use rectangular substrates SB and plates PP and the substrates SB and plates PP are held such that width directions thereof are parallel to a rotary shaft of a transfer roller 431 and also in how to increase and decrease biasing forces. Thus, the following description is centered on points of difference and the same components are denoted by the same reference signs and not described.

In the second embodiment, a contact area where the substrate SB or the like and a blanket BL are in contact by pressing by the transfer roller 431 is constant regardless of the position of the transfer roller 431. Thus, the biasing forces need not be controlled according to the contact area. However, since the blanket BL is sucked and held by suction grooves 312, bending rigidity of the blanket BL is relatively high when the transfer roller 431 is located at a transfer start position or a transfer end position if distances between the suction grooves 312 and the transfer start position and the transfer end position are short as shown in FIG. 11. Here, "bending rigidity" means the rigidity of the blanket BL against a pressing force generated by the biasing of the transfer roller 431, i.e. difficulty to deform, the bending rigidity suddenly increases as the above distances become shorter, and a profile as shown in a graph (b) in FIG. 11 is developed in the transfer apparatus 1. Thus, if biasing forces by pressing portions 434 are set at a constant value regardless of the position of the transfer roller 431 in a traveling direction Y, a pressing force per unit area given to the substrate SB or plate PP from the blanket BL at the transfer start position and the transfer end position decreases as shown by dashed-dotted line of (c) in FIG. 11. On the other hand, on sides closer to a center than the transfer start position and the transfer end position, the bending rigidity is small and stable and the pressing force per unit area has a stable value sufficient for a transfer process. As just described, a problem occurs in which a contact state changes according to the bending rigidity during the travel of the transfer roller 431, more specifically, the pressing force is reduced at the transfer start position and the transfer end position.

Accordingly, in the second embodiment, the transfer process is basically performed in the operation procedure shown in FIG. 7, but Steps S106 to Step 109 of the operation procedure are performed as follows. Specifically, after an alignment adjustment process, a motor 445 rotates a cam member 444, thereby lifting the transfer roller 431 to push up the blanket BL, and the transfer process is started with the upper surface of the blanket BL held in contact with the lower surface of the substrate SB. When the transfer is started at the transfer start position in this way, the biasing forces by the pressing portions 434 are set to be relatively high as shown in a graph (d) in FIG. 11, considering that the bending rigidity is relatively high.

When the substrate SB and the blanket BL come into contact by being pressed by the transfer roller 431, elevation hands 61 move downward and are separated from the blanket BL as shown in FIG. 8C (Step S107) and a roller unit 43 starts traveling in the (+Y) direction (Step S108). Further, during the travel of the transfer roller 431, the biasing forces by the pressing portions 434 are gradually reduced and stabilized at a constant value to deal with a reduction of the bending rigidity as shown in the graph (d) in FIG. 11 described above. Further, as the roller unit 43 further travels in the (+) Y direction and the transfer roller 431 approaches the transfer end position, the biasing forces by the pressing portions 434 are gradually increased to deal with an increase of the bending rigidity. When the transfer roller 431 reaches the transfer end position (when "YES" is determined in Step S109), the biasing forces similar to those at the transfer start position are given to the transfer roller 431. Such a biasing force control is executed by adjusting signals given from a press controller 93 to electropneumatic regulators 931 based on the above correlation data as in the first embodiment, and the pressing force per unit area has a substantially constant value regardless of the position of the transfer roller 431 in the traveling direction Y as shown in the graph (c) in FIG. 11 by this biasing force control. As a result, the transfer can be satisfactorily performed.

Note that the other operation is basically the same as in the first embodiment and subjected to a series of these processes. This causes the entire substrate SB to be held in contact with the blanket BL and the transfer of the pattern or thin film TP to the substrate SB is completed. At this point of time, a movement of the roller unit 43 is stopped and the roller unit 43 is separated from the blanket BL and retracted downwardly (Step S110). The blanket BL and the substrate SB held in close contact in this way are integrally carried out (Step S111) and the transfer process in this transfer apparatus 1 is finished.

As described above, in the second embodiment, the correlation data (see (b) in FIG. 11) indicating a relationship of the position of the transfer roller 431 in the traveling direction Y and the bending rigidity is stored in advance to deal with such a contact state where the bending rigidity is high at the transfer start position and the transfer end position and the pressing force necessary for the transfer tends to be low, and the biasing forces by the pressing portions 434 are controlled based on the position of the transfer roller 431 in the traveling direction Y (see (d) in FIG. 11). That is, by executing a control to suppress the biasing forces when the transfer roller 431 is located at the transfer start position, the transfer end position and positions near these positions where the bending rigidity is relatively high, a variation of the pressing force per unit area given to the substrate SB or plate PP from the blanket BL is suppressed and stabilized to be substantially constant (see (c) in FIG. 11). As a result, the pattern (object to be transferred) can be satisfactorily transferred.

Further, although the invention is applied for the case where the pressing force per unit area changes according to the bending rigidity of the blanket BL, the second embodiment can be applied also when a thickness of the blanket BL varies and is uneven in the traveling direction Y. That is, if the transfer roller 431 is biased with constant biasing forces although the thickness of the blanket BL is uneven, the pressing force per unit area may change according to the Y-direction position of the transfer roller 431. Even in such a case, a variation of the pressing force per unit area can be suppressed and stabilized to be substantially constant and, as a result, the pattern (object to be transferred) can be satisfactorily transferred by storing the correlation data indicating a relationship of the position of the transfer roller 431 in the traveling direction Y and the thickness of the blanket BL in advance and controlling the biasing forces by the pressing portions 434 based on the position of the transfer roller 431 in the traveling direction Y as in the second embodiment.

Further, the contact state may change depending on a pattern as an object to be transferred. For example, a transfer amount of a pattern forming material may vary depending on the type of the pattern and it is desirable to set suitable biasing forces according to that variation. For example, as shown in FIG. 12, pattern elements PT1 to PT3 having mutually different transfer amounts may be included. Here, the transfer amount of the pattern elements PT1 is largest, and the transfer amount becomes smaller in the order of the pattern elements PT2 and PT3. Thus, if the transfer roller 431 is biased with constant biasing forces, the pressing force per unit area may change according to the Y-direction position of the transfer roller 431. For example, in an area where the transfer amount is large such as the pattern element PT1, the pressing force per unit area is insufficient and a sufficient transfer is not performed. Conversely, in an area where the transfer amount is small such as the pattern element PT3, the pressing force per unit area becomes excessive and this pattern element PT3 may be possibly damaged or crushed. In such a case, the pressing force per unit area in bringing the blanket BL and the substrate SB or plate PP into contact is desirably changed according to the transfer amount. In a third embodiment described below, the biasing forces are controlled according to the above transfer amount.

FIG. 12 is a diagram showing the third embodiment of the transfer apparatus according to this invention. In this third embodiment, in transferring a plurality of pattern elements PT1 to PT3 to a substrate SB held on an upper stage 21, biasing forces by pressing portions 434 are controlled according to a transfer amount (see a graph (b) in FIG. 12) of each pattern element PT1 to PT3. More specifically, the transfer amount is computed for each position of a transfer roller 431 in a traveling direction Y in advance and correlation data indicating a relationship of the Y-direction position of the transfer roller 431 (see the graph (b) in FIG. 12) and the transfer amount is stored in a table format in a memory (not shown) of a control unit 9 as information indicating a contact state, and a transfer process is performed using this. Note that the transfer amounts can be calculated based on design data (e.g. CAD data) of the substrate SB. This point is similar also in the following fourth embodiment.

Also in the third embodiment, the transfer process is basically performed in the operation procedure shown in FIG. 7 as in the first embodiment, but Step S108 of the operation procedure is performed as follows. Specifically, during the travel of the transfer roller 431, the biasing forces by the pressing portions 434 are increased and decreased according to the position of the transfer roller 431 as shown in a graph (c) in FIG. 12 by controlling signals given from a press controller 93 to electropneumatic regulators 931 based on the above correlation data. That is, the biasing forces are set to be high in an area where the transfer amount is large and, conversely, the biasing forces are set to be low in an area where the transfer amount is small. In this way, the pressing force per unit area has a substantially constant value regardless of the position of the transfer roller 431 in the traveling direction Y as shown in a graph (d) in FIG. 12. As a result, the transfer can be satisfactorily performed.

Note that the other operation is basically the same as in the first embodiment and subjected to a series of these processes. This causes the entire substrate SB to be held in contact with the blanket BL and the transfer of the pattern or thin film TP to the substrate SB is completed. At this point of time, a movement of a roller unit 43 is stopped and the roller unit 43 is separated from the blanket BL and retracted downwardly (Step S110). The blanket BL and the substrate SB held in close contact in this way are integrally carried out (Step S111) and the transfer process in this transfer apparatus 1 is finished.

As described above, in the third embodiment, the correlation data (see (b) in FIG. 12) indicating the relationship of the above position and the transfer amount is stored in advance as the information indicating the contact state and the biasing forces by the pressing portions 434 are controlled based on the position of the transfer roller 431 in the traveling direction Y (see (c) in FIG. 12) to deal with such a contact state that the transfer amount differs depending on the position of the transfer roller 431 in the traveling direction Y. As a result, a variation of the pressing force per unit area given to the substrate SB or plate PP from the blanket BL is suppressed and stabilized to be substantially constant (see (d) in FIG. 12) and the pattern or thin film PT can be satisfactorily transferred.

As described above, in the transfer apparatuses 1 of the above embodiments, the substrate SB and the blanket BL respectively correspond to a "first plate-like body" and a "second plate-like body" of the invention, and the upper stage 21 and the lower stage 31 respectively function as a "first holding mechanism" and a "second holding mechanism" of the invention. Further, the lower surface of the substrate SB corresponds to an example of "one principal surface of the first plate-like body" of the invention. Further, the upper surface and the lower surface of the blanket BL respectively correspond to examples of "one principal surface of the second plate-like body" and the "other principle surface of the second plate-like body". Further, the transfer roller block 4 and the roller travel driver 5 integrally function as a "pressing mechanism" of the invention. Out of these, the roller travel driver 5 and the transfer roller 431 respectively function as a "traveling unit" and a "roller member" of the invention.

Figure 13:
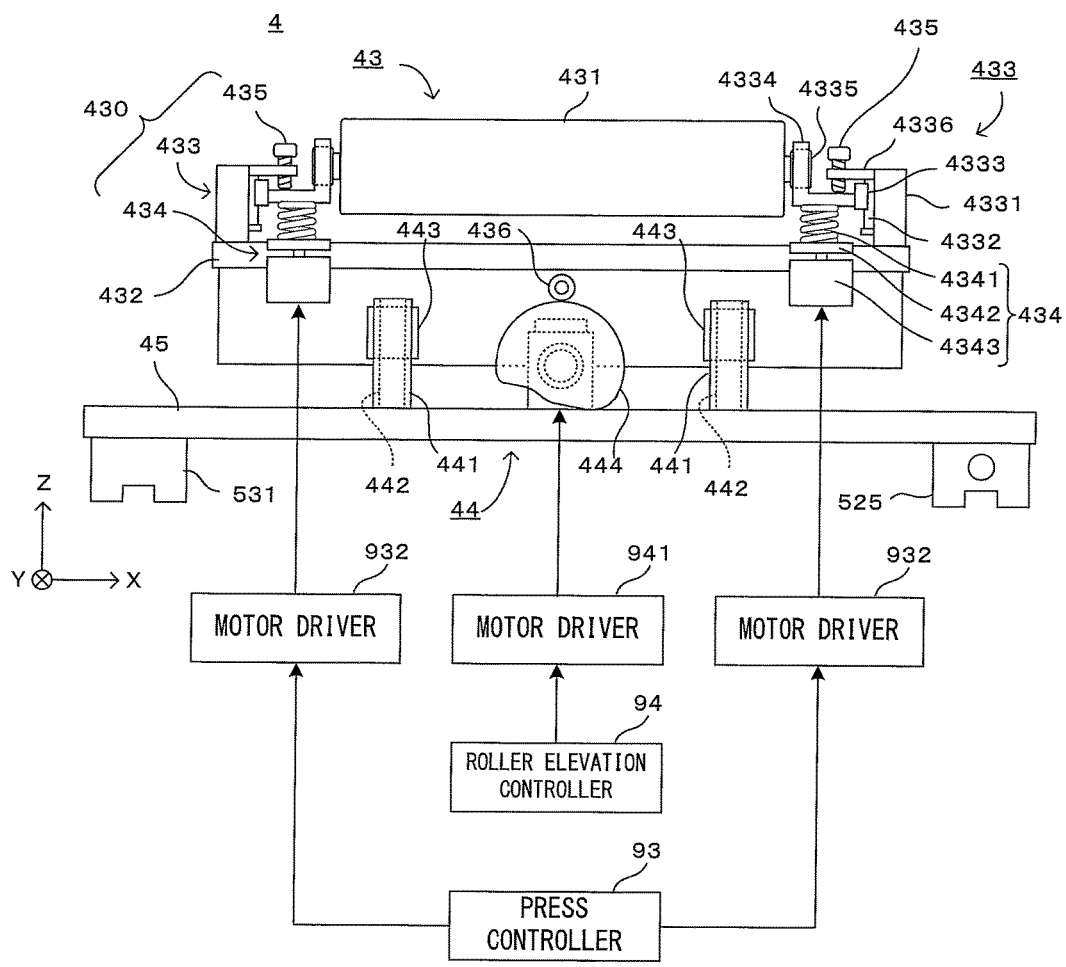
FIG. 13 is a diagram showing the fourth embodiment of the transfer apparatus according to this invention.

Note that the invention is not limited to the above embodiments and various changes other than those described above can be made without departing from the gist of the invention. For example, although the pressing portions 434 are air cylinders in the above embodiments, the configuration of the pressing portions 434 is not limited to this. For example, as shown in FIG. 13, a combination of a spring 4341, a spring supporting member 4342 and a motor 4343 may be used as the pressing portion 434. Specifically, the spring 4341 is supported movably upward and downward in the vertical direction Z by the spring supporting member 4342 immediately below the supporting angle 4334. This spring supporting member 4242 is connected to the motor 4343. The motor 4343 is actuated by the motor driver 932 having received a signal from the roller elevation controller 94 to elevate the spring supporting member 4342, whereby the spring 4341 biases the transfer roller 431 supported by the supporting angle 4334 upwardly. Note that an elastic body such as elastic resin may be used instead of the spring 4341.

Further, although the biasing forces applied to the transfer roller 431 by the pressing portions 434 are controlled to correspond to each of different contact states in the above first to fourth embodiments, the biasing forces may be controlled by combining all or some of these embodiments.

Further, although the plurality of elevation hands 61 are supported by the supporting frame 62 and integrally moved upward and downward in the above embodiments, individual elevation hands may be configured to independently move upward and downward, for example, as described in patent literature 1. According to this configuration, the posture of the blanket can be more reliably controlled by successively lowering the elevation hands according to the travel of the transfer roller, wherefore this configuration is effective, for example, in enlarging substrates. Further, instead of the bar-like elevation hands 61, the blanket may be supported by a member having a flat upper surface.

Further, although the invention is applied to the transfer apparatus for transferring an object to be transferred such as a pattern carried on the blanket BL to the substrate SB in the above embodiments, a technical concept included in the first and second embodiments out of these embodiments is not limited to such transfer apparatuses for transferring a pattern or the like, and can be applied, for example, to a technique for bonding two plate-like bodies without via a pattern or the like.

As the specific embodiments have been illustrated and described above, the pressing portion may be configured to change a force for biasing the roller member according to the position of the roller member in the traveling direction in the transfer apparatus according to the invention.

Further, when a contact area of the first and second plate-like bodies changes according to the position of the roller member in the traveling direction, the pressing portion may obtain a relationship of position information indicating the position of the roller member in the traveling direction and the contact area as the contact state and control the force for biasing the roller member based on the position information.

Further, when the transfer amount of the object to be transferred varies according to the position of the roller member in the traveling direction, the pressing portion may obtain a relationship of the position information indicating the position of the roller member in the traveling direction and the transfer amount as the contact state and control the force for biasing the roller member based on the position information.

Further, when the bending rigidity using the difficulty of the second plate-like body to deform as an index varies according to the position of the roller member in the traveling direction, the pressing portion may obtain a relationship of the position information indicating the position of the roller member in the traveling direction and the bending rigidity as the contact state and control the force for biasing the roller member based on the position information.

Further, when a thickness in a pressing direction of the plate-like body is uneven in the traveling direction, the pressing portion may obtain a relationship of the position information indicating the position of the roller member in the traveling direction and the thickness of the second plate-like body as the contact state and control the force for biasing the roller member based on the position information.

Further, the pressing mechanism may include a pair of bearing portions for rotatably supporting each of both end parts in an axial direction of the roller member, and the pressing portion may independently bias each bearing portion in the pressing direction and control the force for biasing the roller member according to the contact state of the first and second plate-like bodies in the axial direction.

Further, when the transfer amount of the object to be transferred in the axial direction differs, the pressing portion may make forces of the respective bearing portions for biasing the roller member different based on transfer amount information relating to the transfer amount of the object to be transferred.

Further, in the transfer method according to the invention, the force for biasing the roller member may be changed according to the position of the roller member in the traveling direction, for example, in a transferring step.

Furthermore, in the transferring step, a force for biasing one end part in the axial direction of the roller member in the pressing direction and a force for biasing the other end part in the pressing direction may be controlled according to the contact state of the first and second plate-like bodies in the axial direction.

This invention is suitably applicable to a process for transferring an object to be transferred such as a pattern or thin film to various plate-like bodies such as glass substrates and semiconductor substrates. Further, the technical concept of the invention is applicable also in the case of directly bringing two plate-like bodies into contact without via a pattern or the like.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A transfer apparatus that brings one principal surface of a first plate-like body and one principal surface of a second plate-like body into contact and transfers an object to be transferred carried on one of the first and second plate-like bodies to the other, comprising:
    a first holding mechanism that holds the first plate-like body;
    a second holding mechanism that proximately holds the second plate-like body while causing the one principal surface of the second plate-like body to face the one principal surface of the first plate-like body held by the first holding mechanism; and
    a pressing mechanism that presses the second plate-like body against the first plate-like body in a pressing direction from the second plate-like body toward the first plate-like body, wherein:
    the pressing mechanism includes:
    a roller member movable in a traveling direction perpendicular to a rotary shaft and parallel to the other principal surface of the second plate-like body while rotating about the rotary shaft parallel to the other principal surface of the second plate-like body with respect to the other principal surface of the second plate-like body;
    a pressing portion that applies a pressing force from the second plate-like body to the first plate-like body by biasing the roller member against the other principal surface of the second plate-like body in the pressing direction; and
    a traveling unit that causes the roller member biased by the pressing portion to travel in the traveling direction; wherein
    the pressing portion changes a force for biasing the roller member according to a contact state of the first and second plate-like bodies during travel of the roller member to suppress a variation of a pressing force per unit area given from the second plate-like body to the first plate-like body during the travel,
    the pressing portion changes the force for biasing the roller member according to the position of the roller member in the traveling direction, and
    when a contact area of the first and second plate-like bodies changes according to the position of the roller member in the traveling direction, the pressing portion obtains a relationship of position information indicating the position of the roller member in the traveling direction and the contact area as the contact state and controls the force for biasing the roller member based on the position information.

2. A transfer apparatus that brings one principal surface of a first plate-like body and one principal surface of a second plate-like body into contact and transfers an object to be transferred carried on one of the first and second plate-like bodies to the other, comprising:
    a first holding mechanism that holds the first plate-like body;
    a second holding mechanism that proximately holds the second plate-like body while causing the one principal surface of the second plate-like body to face the one principal surface of the first plate-like body held by the first holding mechanism; and
    a pressing mechanism that presses the second plate-like body against the first plate-like body in a pressing direction from the second plate-like body toward the first plate-like body, wherein:
    the pressing mechanism includes:
    a roller member movable in a traveling direction perpendicular to a rotary shaft and parallel to the other principal surface of the second plate-like body while rotating about the rotary shaft parallel to the other principal surface of the second plate-like body with respect to the other principal surface of the second plate-like body;
    a pressing portion that applies a pressing force from the second plate-like body to the first plate-like body by biasing the roller member against the other principal surface of the second plate-like body in the pressing direction; and
    a traveling unit that causes the roller member biased by the pressing portion to travel in the traveling direction; wherein
    the pressing portion changes a force for biasing the roller member according to a contact state of the first and second plate-like bodies during travel of the roller member to suppress a variation of a pressing force per unit area given from the second plate-like body to the first plate-like body during the travel,
    the pressing portion changes the force for biasing the roller member according to the position of the roller member in the traveling direction, and
    when a transfer amount of the object to be transferred varies according to the position of the roller member in the traveling direction, the pressing portion obtains a relationship of position information indicating the position of the roller member in the traveling direction and the transfer amount as the contact state and controls the force for biasing the roller member based on the position information.

3. A transfer apparatus that brings one principal surface of a first plate-like body and one principal surface of a second plate-like body into contact and transfers an object to be transferred carried on one of the first and second plate-like bodies to the other, comprising:
    a first holding mechanism that holds the first plate-like body;
    a second holding mechanism that proximately holds the second plate-like body while causing the one principal surface of the second plate-like body to face the one principal surface of the first plate-like body held by the first holding mechanism; and
    a pressing mechanism that presses the second plate-like body against the first plate-like body in a pressing direction from the second plate-like body toward the first plate-like body, wherein:

the pressing mechanism includes:
a roller member movable in a traveling direction perpendicular to a rotary shaft and parallel to the other principal surface of the second plate-like body while rotating about the rotary shaft parallel to the other principal surface of the second plate-like body with respect to the other principal surface of the second plate-like body;
a pressing portion that applies a pressing force from the second plate-like body to the first plate-like body by biasing the roller member against the other principal surface of the second plate-like body in the pressing direction; and
a traveling unit that causes the roller member biased by the pressing portion to travel in the traveling direction; wherein
the pressing portion changes a force for biasing the roller member according to a contact state of the first and second plate-like bodies during travel of the roller member to suppress a variation of a pressing force per unit area given from the second plate-like body to the first plate-like body during the travel,
the pressing portion changes the force for biasing the roller member according to the position of the roller member in the traveling direction, and
when bending rigidity using the difficulty of the second plate-like body to deform as an index varies according to the position of the roller member in the traveling direction, the pressing portion obtains a relationship of position information indicating the position of the roller member in the traveling direction and the bending rigidity as the contact state and controls the force for biasing the roller member based on the position information.

4. A transfer apparatus that brings one principal surface of a first plate-like body and one principal surface of a second plate-like body into contact and transfers an object to be transferred carried on one of the first and second plate-like bodies to the other, comprising:
a first holding mechanism that holds the first plate-like body;
a second holding mechanism that proximately holds the second plate-like body while causing the one principal surface of the second plate-like body to face the one principal surface of the first plate-like body held by the first holding mechanism; and
a pressing mechanism that presses the second plate-like body against the first plate-like body in a pressing direction from the second plate-like body toward the first plate-like body, wherein:
the pressing mechanism includes:
a roller member movable in a traveling direction perpendicular to a rotary shaft and parallel to the other principal surface of the second plate-like body while rotating about the rotary shaft parallel to the other principal surface of the second plate-like body with respect to the other principal surface of the second plate-like body;
a pressing portion that applies a pressing force from the second plate-like body to the first plate-like body by biasing the roller member against the other principal surface of the second plate-like body in the pressing direction; and
a traveling unit that causes the roller member biased by the pressing portion to travel in the traveling direction; wherein the pressing portion changes a force for biasing the roller member according to a contact state of the first and second plate-like bodies during travel of the roller member to suppress a variation of a pressing force per unit area given from the second plate-like body to the first plate-like body during the travel,
the pressing portion changes the force for biasing the roller member according to the position of the roller member in the traveling direction, and
when a thickness of the plate-like body in the pressing direction is uneven in the traveling direction, the pressing portion obtains a relationship of position information indicating the position of the roller member in the traveling direction and the thickness of the second plate-like body as the contact state and controls the force for biasing the roller member based on the position information.

5. A transfer apparatus that brings one principal surface of a first plate-like body and one principal surface of a second plate-like body into contact and transfers an object to be transferred carried on one of the first and second plate-like bodies to the other, comprising:
a first holding mechanism that holds the first plate-like body;
a second holding mechanism that proximately holds the second plate-like body while causing the one principal surface of the second plate-like body to face the one principal surface of the first plate-like body held by the first holding mechanism; and
a pressing mechanism that presses the second plate-like body against the first plate-like body in a pressing direction from the second plate-like body toward the first plate-like body, wherein:
the pressing mechanism includes:
a roller member movable in a traveling direction perpendicular to a rotary shaft and parallel to the other principal surface of the second plate-like body while rotating about the rotary shaft parallel to the other principal surface of the second plate-like body with respect to the other principal surface of the second plate-like body;
a pressing portion that applies a pressing force from the second plate-like body to the first plate-like body by biasing the roller member against the other principal surface of the second plate-like body in the pressing direction; and
a traveling unit that causes the roller member biased by the pressing portion to travel in the traveling direction; wherein:
the pressing portion changes a force for biasing the roller member according to a contact state of the first and second plate-like bodies during travel of the roller member to suppress a variation of a pressing force per unit area given from the second plate-like body to the first plate-like body during the travel; and
the pressing mechanism includes a pair of bearing portions for rotatably supporting each of both end parts of the roller member in an axial direction; and
the pressing portion independently biases each bearing portion in the pressing direction and controls the force for biasing the roller member according to a contact state of the first and second plate-like bodies in the axial direction.

6. The transfer apparatus according to claim 5, wherein:
when a transfer amount of the object to be transferred in the axial direction differs, the pressing portion makes forces of the respective bearing portions for biasing the roller member different based on transfer amount information relating to the transfer amount of the object to be transferred.

7. A transfer method that brings one principal surface of a first plate-like body and one principal surface of a second plate-like body into contact and transferring an object to be transferred carried on one of the first and second plate-like bodies to the other, comprising:
   a supporting step of supporting the one principal surface of the first plate-like body and the one principal surface of the second plate-like body proximately facing each other across the object to be transferred; and
   a transferring step of rolling a roller member including a rotary shaft parallel to the other principal surface of the second plate-like body with respect to the second plate-like body in a traveling direction perpendicular to the rotary shaft and parallel to the other principal surface of the second plate-like body to transfer the object to be transferred while biasing the roller member in a pressing direction from the second plate-like body toward the first plate-like body and pressing the second plate-like body against the first plate-like body; wherein
   the transferring step includes a step of changing a force for biasing the roller member according to a contact state of the first and second plate-like bodies during travel of the roller member and suppressing a variation of a pressing force per unit area given from the second plate-like body to the first plate-like body during the travel, and
   a force for biasing one end part in an axial direction of the roller member in the pressing direction and a force for biasing the other end part in the pressing direction are controlled according to a contact state of the first and second plate-like bodies in the axial direction.

8. The transfer method according to claim 7, wherein:
   the force for biasing the roller member is changed according to the position of the roller member in the traveling direction in the transferring step.

* * * * *